(12) United States Patent
Vorbach et al.

(10) Patent No.: US 7,595,659 B2
(45) Date of Patent: Sep. 29, 2009

(54) LOGIC CELL ARRAY AND BUS SYSTEM

(75) Inventors: Martin Vorbach, München (DE); Frank May, München (DE); Dirk Reichardt, München (DE); Frank Lier, München (DE); Gerd Ehlers, Grasbrunn (DE); Armin Nückel, Neupotz (DE); Volker Baumgarte, München (DE); Prashant Rao, München (DE); Jens Oertel, Bad Bergazabern (DE)

(73) Assignee: Pact XPP Technologies AG, Munich (DE)

( * ) Notice: Subject to any disclaimer, the term of this patent is extended or adjusted under 35 U.S.C. 154(b) by 567 days.

(21) Appl. No.: 10/398,546

(22) PCT Filed: Oct. 8, 2001

(86) PCT No.: PCT/EP01/11593

§ 371 (c)(1),
(2), (4) Date: Jan. 20, 2004

(87) PCT Pub. No.: WO02/29600

PCT Pub. Date: Apr. 11, 2002

(65) Prior Publication Data

US 2004/0128474 A1    Jul. 1, 2004

(30) Foreign Application Priority Data

| Oct. 9, 2000 | (WO) | PCT/EP00/10516 |
|---|---|---|
| Mar. 5, 2001 | (DE) | 101 10 530 |
| Mar. 7, 2001 | (DE) | 101 11 014 |
| Jul. 24, 2001 | (DE) | 101 35 210 |
| Jul. 24, 2001 | (DE) | 101 35 211 |
| Aug. 16, 2001 | (DE) | 101 39 170 |
| Aug. 29, 2001 | (DE) | 101 42 231 |
| Sep. 3, 2001 | (DE) | 101 42 894 |
| Sep. 3, 2001 | (DE) | 101 42 903 |
| Sep. 3, 2001 | (DE) | 101 42 904 |
| Sep. 11, 2001 | (DE) | 101 44 732 |
| Sep. 11, 2001 | (DE) | 101 44 733 |
| Sep. 17, 2001 | (DE) | 101 45 792 |
| Sep. 17, 2001 | (DE) | 101 45 795 |
| Sep. 19, 2001 | (DE) | 101 46 132 |
| Sep. 30, 2001 | (WO) | PCT/EP01/11299 |

(51) Int. Cl.
*H03K 19/177* (2006.01)
*G06F 7/52* (2006.01)
*G06F 15/00* (2006.01)

(52) U.S. Cl. ............... 326/39; 326/38; 326/41; 708/620; 708/501; 712/11; 712/10

(58) Field of Classification Search ............. 326/38–41; 708/501, 620
See application file for complete search history.

(56) References Cited

U.S. PATENT DOCUMENTS 2,067,477 A    1/1937    Cooper (Continued)

FOREIGN PATENT DOCUMENTS

DE    42 21 278    1/1994

(Continued)

OTHER PUBLICATIONS

Ade et al., "Minimum Memory Buffers in DSP Applications," Electronics Letters, vol. 30, No. 6, Mar. 17, 1994, pp. 469-471.

(Continued)

*Primary Examiner*—Vibol Tan
(74) *Attorney, Agent, or Firm*—Kenyon & Kenyon LLP

(57) ABSTRACT

A logic cell array having a number of logic cells and a segmented bus system for logic cell communication, the bus system including different segment lines having shorter and longer segments for connecting two points in order to be able to minimize the number of bus elements traversed between separate communication start and end points.

129 Claims, 11 Drawing Sheets

U.S. PATENT DOCUMENTS

| | | |
|---|---|---|
| 3,242,998 A | 3/1966 | Gubbins |
| 3,681,578 A | 8/1972 | Stevens |
| 3,757,608 A | 9/1973 | Willner |
| 3,855,577 A | 12/1974 | Vandierendonck |
| 4,233,667 A | 11/1980 | Devine et al. |
| 4,414,547 A | 11/1983 | Knapp et al. |
| 4,498,134 A | 2/1985 | Etchells et al. |
| 4,498,172 A | 2/1985 | Bhavsar |
| 4,566,102 A | 1/1986 | Hefner |
| 4,590,583 A | 5/1986 | Miller |
| 4,591,979 A | 5/1986 | Iwashita |
| 4,663,706 A | 5/1987 | Allen et al. |
| 4,667,190 A | 5/1987 | Fant et al. |
| 4,682,284 A | 7/1987 | Schrofer |
| 4,706,216 A | 11/1987 | Carter |
| 4,720,780 A | 1/1988 | Dolecek |
| 4,739,474 A | 4/1988 | Holsztynski |
| 4,761,755 A | 8/1988 | Ardini et al. |
| 4,811,214 A | 3/1989 | Nosenchuck et al. |
| 4,852,043 A | 7/1989 | Guest |
| 4,852,048 A | 7/1989 | Morton |
| 4,860,201 A | 8/1989 | Miranker et al. |
| 4,870,302 A | 9/1989 | Freeman |
| 4,882,687 A | 11/1989 | Gordon |
| 4,891,810 A | 1/1990 | de Corlieu et al. |
| 4,901,268 A | 2/1990 | Judd |
| 4,910,665 A | 3/1990 | Mattheyses et al. |
| 4,918,440 A | 4/1990 | Furtek et al. |
| 4,967,340 A | 10/1990 | Dawes |
| 4,972,314 A | 11/1990 | Getzinger et al. |
| 5,010,401 A | 4/1991 | Murakami et al. |
| 5,014,193 A | 5/1991 | Garner et al. |
| 5,015,884 A | 5/1991 | Agrawal et al. |
| 5,021,947 A | 6/1991 | Campbell et al. |
| 5,023,775 A | 6/1991 | Poret |
| 5,034,914 A | 7/1991 | Osterlund |
| 5,041,924 A | 8/1991 | Blackborow et al. |
| 5,043,978 A | 8/1991 | Nagler et al. |
| 5,047,924 A | 9/1991 | Matsubara et al. |
| 5,065,308 A | 11/1991 | Evans |
| 5,072,178 A | 12/1991 | Matsumoto |
| 5,081,375 A | 1/1992 | Pickett et al. |
| 5,099,447 A | 3/1992 | Myszewski |
| 5,109,503 A | 4/1992 | Cruickshank et al. |
| 5,113,498 A | 5/1992 | Evan et al. |
| 5,115,510 A | 5/1992 | Okamoto et al. |
| 5,123,109 A | 6/1992 | Hillis |
| 5,125,801 A | 6/1992 | Nabity et al. |
| 5,128,559 A | 7/1992 | Steele |
| 5,142,469 A | 8/1992 | Weisenborn |
| 5,144,166 A | 9/1992 | Camarota et al. |
| 5,182,474 A * | 1/1993 | Kaneko .................. 219/69.18 |
| 5,193,202 A | 3/1993 | Lee et al. |
| 5,203,005 A | 4/1993 | Horst |
| 5,204,935 A | 4/1993 | Mihara et al. |
| 5,208,491 A | 5/1993 | Ebeling et al. |
| 5,212,716 A | 5/1993 | Ferraiolo et al. |
| 5,218,302 A | 6/1993 | Loewe et al. |
| 5,226,122 A | 7/1993 | Thayer et al. |
| RE34,363 E | 8/1993 | Freeman |
| 5,233,539 A | 8/1993 | Agrawal et al. |
| 5,237,686 A | 8/1993 | Asano et al. |
| 5,247,689 A | 9/1993 | Ewert |
| RE34,444 E | 11/1993 | Kaplinsky |
| 5,274,593 A | 12/1993 | Proebsting |
| 5,276,836 A | 1/1994 | Fukumaru et al. |
| 5,287,472 A | 2/1994 | Horst |
| 5,287,532 A | 2/1994 | Hunt |
| 5,294,119 A | 3/1994 | Vincent et al. |
| 5,301,284 A | 4/1994 | Estes et al. |
| 5,301,344 A | 4/1994 | Kolchinsky |
| 5,303,172 A | 4/1994 | Magar et al. |
| 5,311,079 A | 5/1994 | Ditlow et al. |
| 5,327,125 A | 7/1994 | Iwase et al. |
| 5,336,950 A | 8/1994 | Popli et al. |
| 5,343,406 A | 8/1994 | Freeman et al. |
| 5,347,639 A | 9/1994 | Rechtschaffen et al. |
| 5,349,193 A | 9/1994 | Mott et al. |
| 5,353,432 A | 10/1994 | Richek et al. |
| 5,361,373 A | 11/1994 | Gilson |
| 5,379,444 A | 1/1995 | Mumme |
| 5,392,437 A | 2/1995 | Matter et al. |
| 5,410,723 A | 4/1995 | Schmidt et al. |
| 5,418,952 A | 5/1995 | Morley et al. |
| 5,418,953 A | 5/1995 | Hunt et al. |
| 5,421,019 A | 5/1995 | Holsztynski et al. |
| 5,422,823 A | 6/1995 | Agrawal et al. |
| 5,425,036 A | 6/1995 | Liu et al. |
| 5,426,378 A | 6/1995 | Ong |
| 5,428,526 A | 6/1995 | Flood et al. |
| 5,430,687 A | 7/1995 | Hung et al. |
| 5,440,245 A | 8/1995 | Galbraith et al. |
| 5,440,538 A | 8/1995 | Olsen et al. |
| 5,442,790 A | 8/1995 | Nosenchuck |
| 5,444,394 A | 8/1995 | Watson et al. |
| 5,448,186 A | 9/1995 | Kawata |
| 5,455,525 A | 10/1995 | Ho et al. |
| 5,457,644 A | 10/1995 | McCollum |
| 5,465,375 A | 11/1995 | Thepaut et al. |
| 5,469,003 A | 11/1995 | Kean |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,497,498 A | 3/1996 | Taylor |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |
| 5,521,837 A | 5/1996 | Frankle et al. |
| 5,522,083 A | 5/1996 | Gove et al. |
| 5,530,873 A | 6/1996 | Takano |
| 5,530,946 A | 6/1996 | Bouvier et al. |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,570,040 A | 10/1996 | Lytle et al. |
| 5,574,930 A | 11/1996 | Halverson, Jr. et al. |
| 5,581,731 A | 12/1996 | King et al. |
| 5,583,450 A | 12/1996 | Trimberger et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,348 A | 12/1996 | Phillips et al. |
| 5,596,742 A | 1/1997 | Agarwal et al. |
| 5,600,265 A | 2/1997 | El Gamal et al. |

| | | | | | | |
|---|---|---|---|---|---|---|
| 5,600,845 A | 2/1997 | Gilson | 5,933,023 A | 8/1999 | Young | |
| 5,611,049 A | 3/1997 | Pitts | 5,933,642 A | 8/1999 | Baxter et al. | |
| 5,617,547 A | 4/1997 | Feeney et al. | 5,936,424 A | 8/1999 | Young et al. | |
| 5,625,806 A | 4/1997 | Kromer | 5,943,242 A * | 8/1999 | Vorbach et al. | 716/17 |
| 5,625,836 A | 4/1997 | Barker et al. | 5,956,518 A | 9/1999 | DeHon et al. | |
| 5,634,131 A | 5/1997 | Matter et al. | 5,960,193 A | 9/1999 | Guttag et al. | |
| 5,646,544 A | 7/1997 | Iadanza | 5,966,143 A | 10/1999 | Breternitz, Jr. | |
| 5,646,545 A | 7/1997 | Trimberger et al. | 5,966,534 A | 10/1999 | Cooke et al. | |
| 5,649,176 A | 7/1997 | Selvidge et al. | 5,970,254 A | 10/1999 | Cooke et al. | |
| 5,649,179 A | 7/1997 | Steenstra et al. | 5,978,260 A | 11/1999 | Trimberger et al. | |
| 5,652,529 A | 7/1997 | Gould et al. | 5,996,083 A | 11/1999 | Gupta et al. | |
| 5,652,894 A | 7/1997 | Hu et al. | 5,999,990 A | 12/1999 | Sharrit et al. | |
| 5,655,069 A | 8/1997 | Ogawara et al. | 6,003,143 A | 12/1999 | Kim et al. | |
| 5,655,124 A | 8/1997 | Lin | 6,011,407 A | 1/2000 | New | |
| 5,657,330 A | 8/1997 | Matsumoto | 6,014,509 A | 1/2000 | Furtek et al. | |
| 5,659,797 A | 8/1997 | Zandveld et al. | 6,020,758 A | 2/2000 | Patel et al. | |
| 5,675,743 A | 10/1997 | Mavity | 6,020,760 A | 2/2000 | Sample et al. | |
| 5,675,757 A * | 10/1997 | Davidson et al. 712/201 | 6,021,490 A | 2/2000 | Vorbach et al. | |
| 5,680,583 A | 10/1997 | Kuijsten | 6,023,564 A | 2/2000 | Trimberger | |
| 5,694,602 A | 12/1997 | Smith | 6,023,742 A | 2/2000 | Ebeling et al. | |
| 5,713,037 A | 1/1998 | Wilkinson et al. | 6,034,538 A | 3/2000 | Abramovici | |
| 5,717,943 A | 2/1998 | Barker et al. | 6,035,371 A | 3/2000 | Magloire | |
| 5,732,209 A | 3/1998 | Vigil et al. | 6,038,650 A | 3/2000 | Vorbach et al. | |
| 5,734,921 A | 3/1998 | Dapp et al. | 6,038,656 A | 3/2000 | Cummings et al. | |
| 5,737,516 A | 4/1998 | Circello et al. | 6,044,030 A | 3/2000 | Zhang et al. | |
| 5,737,565 A | 4/1998 | Mayfield | 6,047,115 A | 4/2000 | Mohan et al. | |
| 5,742,180 A | 4/1998 | Detton et al. | 6,049,222 A | 4/2000 | Lawman | |
| 5,748,872 A | 5/1998 | Norman | 6,052,773 A | 4/2000 | DeHon et al. | |
| 5,748,979 A | 5/1998 | Trimberger | 6,054,873 A | 4/2000 | Laramie | |
| 5,752,035 A | 5/1998 | Trimberger | 6,055,619 A * | 4/2000 | North et al. | 712/36 |
| 5,754,459 A | 5/1998 | Telikepalli | 6,058,469 A | 5/2000 | Baxter | |
| 5,754,820 A | 5/1998 | Yamagami | 6,077,315 A | 6/2000 | Greenbaum et al. | |
| 5,754,827 A | 5/1998 | Barbier et al. | 6,081,903 A | 6/2000 | Vorbach et al. | |
| 5,754,871 A | 5/1998 | Wilkinson et al. | 6,084,429 A * | 7/2000 | Trimberger | 326/41 |
| 5,760,602 A | 6/1998 | Tan | 6,085,317 A | 7/2000 | Smith | |
| 5,761,484 A | 6/1998 | Agarwal et al. | 6,086,628 A | 7/2000 | Dave et al. | |
| 5,773,994 A | 6/1998 | Jones | 6,088,795 A | 7/2000 | Vorbach et al. | |
| 5,778,439 A | 7/1998 | Trimberger et al. | 6,092,174 A | 7/2000 | Roussakov | |
| 5,781,756 A | 7/1998 | Hung | 6,105,105 A | 8/2000 | Trimberger et al. | |
| 5,784,636 A | 7/1998 | Rupp | 6,105,106 A | 8/2000 | Manning | |
| 5,794,059 A | 8/1998 | Barker et al. | 6,108,760 A | 8/2000 | Mirsky et al. | |
| 5,794,062 A | 8/1998 | Baxter | 6,119,181 A | 9/2000 | Vorbach et al. | |
| 5,801,547 A | 9/1998 | Kean | 6,122,719 A | 9/2000 | Mirsky et al. | |
| 5,801,715 A | 9/1998 | Norman | 6,125,408 A | 9/2000 | McGee et al. | |
| 5,802,290 A | 9/1998 | Casselman | 6,127,908 A | 10/2000 | Bozler et al. | |
| 5,828,229 A | 10/1998 | Cliff et al. | 6,134,166 A | 10/2000 | Lytle et al. | |
| 5,828,858 A | 10/1998 | Athanas et al. | 6,137,307 A | 10/2000 | Iwanczuk et al. | |
| 5,831,448 A | 11/1998 | Kean | 6,150,837 A | 11/2000 | Beal et al. | |
| 5,838,165 A | 11/1998 | Chatter | 6,150,839 A | 11/2000 | New et al. | |
| 5,841,973 A | 11/1998 | Kessler et al. | 6,154,048 A | 11/2000 | Iwanczuk et al. | |
| 5,844,422 A | 12/1998 | Trimberger et al. | 6,154,049 A | 11/2000 | New | |
| 5,844,888 A | 12/1998 | Markkula, Jr. et al. | 6,157,214 A | 12/2000 | Marshall | |
| 5,848,238 A | 12/1998 | Shimomura et al. | 6,170,051 B1 | 1/2001 | Dowling | |
| 5,854,918 A | 12/1998 | Baxter | 6,172,520 B1 | 1/2001 | Lawman et al. | |
| 5,857,097 A | 1/1999 | Henzinger et al. | 6,173,434 B1 | 1/2001 | Wirthlin et al. | |
| 5,859,544 A | 1/1999 | Norman | 6,185,256 B1 * | 2/2001 | Saito et al. | 375/257 |
| 5,862,403 A | 1/1999 | Kanai et al. | 6,185,731 B1 | 2/2001 | Maeda et al. | |
| 5,865,239 A | 2/1999 | Carr | 6,188,240 B1 | 2/2001 | Nakaya | |
| 5,867,691 A | 2/1999 | Shiraishi | 6,198,304 B1 * | 3/2001 | Sasaki | 326/39 |
| 5,867,723 A | 2/1999 | Peters et al. | 6,201,406 B1 | 3/2001 | Iwanczuk et al. | |
| 5,870,620 A | 2/1999 | Kadosumi et al. | 6,202,182 B1 | 3/2001 | Abramovici et al. | |
| 5,884,075 A | 3/1999 | Hester et al. | 6,204,687 B1 | 3/2001 | Schultz et al. | |
| 5,887,162 A | 3/1999 | Williams et al. | 6,211,697 B1 | 4/2001 | Lien et al. | |
| 5,887,165 A | 3/1999 | Martel et al. | 6,212,650 B1 | 4/2001 | Guccione | |
| 5,889,533 A | 3/1999 | Lee | 6,215,326 B1 | 4/2001 | Jefferson et al. | |
| 5,889,982 A | 3/1999 | Rodgers et al. | 6,216,223 B1 | 4/2001 | Revilla et al. | |
| 5,892,370 A | 4/1999 | Eaton et al. | 6,219,833 B1 | 4/2001 | Solomon et al. | |
| 5,892,961 A | 4/1999 | Trimberger | RE37,195 E | 5/2001 | Kean | |
| 5,901,279 A | 5/1999 | Davis, III | 6,230,307 B1 | 5/2001 | Davis et al. | |
| 5,915,123 A | 6/1999 | Mirsky et al. | 6,240,502 B1 | 5/2001 | Panwar et al. | |
| 5,924,119 A | 7/1999 | Sindhu et al. | 6,243,808 B1 | 6/2001 | Wang | |
| 5,926,638 A | 7/1999 | Inoue | 6,252,792 B1 | 6/2001 | Marshall et al. | |
| 5,927,423 A | 7/1999 | Wada et al. | 6,256,724 B1 | 7/2001 | Hocevar et al. | |

| | | |
|---|---|---|
| 6,260,179 B1 | 7/2001 | Ohsawa et al. |
| 6,262,908 B1 | 7/2001 | Marshall et al. |
| 6,263,430 B1 | 7/2001 | Trimberger et al. |
| 6,279,077 B1 | 8/2001 | Nasserbakht et al. |
| 6,282,627 B1 | 8/2001 | Wong et al. |
| 6,282,701 B1 | 8/2001 | Wygodny et al. |
| 6,285,624 B1 * | 9/2001 | Chen ............ 365/230.03 |
| 6,286,134 B1 | 9/2001 | Click, Jr. et al. |
| 6,288,566 B1 | 9/2001 | Hanrahan et al. |
| 6,289,440 B1 | 9/2001 | Casselman |
| 6,298,472 B1 | 10/2001 | Phillips et al. |
| 6,301,706 B1 | 10/2001 | Maslennikov et al. |
| 6,311,200 B1 | 10/2001 | Hanrahan et al. |
| 6,311,265 B1 | 10/2001 | Beckerle et al. |
| 6,321,366 B1 | 11/2001 | Tseng et al. |
| 6,321,373 B1 | 11/2001 | Ekanadham et al. |
| 6,338,106 B1 | 1/2002 | Vorbach et al. |
| 6,341,318 B1 | 1/2002 | Dakhil |
| 6,347,346 B1 | 2/2002 | Taylor |
| 6,349,346 B1 | 2/2002 | Hanrahan et al. |
| 6,353,841 B1 | 3/2002 | Marshall et al. |
| 6,362,650 B1 | 3/2002 | New et al. |
| 6,370,596 B1 | 4/2002 | Dakhil |
| 6,373,779 B1 | 4/2002 | Pang et al. |
| 6,374,286 B1 | 4/2002 | Gee |
| 6,378,068 B1 | 4/2002 | Foster et al. |
| 6,381,624 B1 * | 4/2002 | Colon-Bonet et al. ....... 708/501 |
| 6,389,379 B1 | 5/2002 | Lin et al. |
| 6,389,579 B1 | 5/2002 | Phillips et al. |
| 6,392,912 B1 | 5/2002 | Hanrahan et al. |
| 6,398,383 B1 | 6/2002 | Huang |
| 6,400,601 B1 | 6/2002 | Sudo et al. |
| 6,404,224 B1 | 6/2002 | Azegami et al. |
| 6,405,299 B1 * | 6/2002 | Vorbach et al. ............. 712/11 |
| 6,421,809 B1 | 7/2002 | Wuytack et al. |
| 6,421,817 B1 | 7/2002 | Mohan et al. |
| 6,425,054 B1 | 7/2002 | Nguyen |
| 6,425,068 B1 | 7/2002 | Vorbach et al. |
| 6,427,156 B1 | 7/2002 | Chapman et al. |
| 6,430,309 B1 | 8/2002 | Pressman et al. |
| 6,434,642 B1 | 8/2002 | Camilleri et al. |
| 6,434,695 B1 | 8/2002 | Esfahani et al. |
| 6,434,699 B1 | 8/2002 | Jones et al. |
| 6,435,054 B1 | 8/2002 | Duckeck et al. |
| 6,437,441 B1 | 8/2002 | Yamamoto |
| 6,438,747 B1 | 8/2002 | Schreiber et al. |
| 6,457,116 B1 | 9/2002 | Mirsky et al. |
| 6,476,634 B1 | 11/2002 | Bilski |
| 6,477,643 B1 | 11/2002 | Vorbach et al. |
| 6,480,937 B1 | 11/2002 | Vorbach et al. |
| 6,480,954 B2 | 11/2002 | Trimberger et al. |
| 6,487,709 B1 * | 11/2002 | Keller et al. .................. 716/14 |
| 6,490,695 B1 | 12/2002 | Zagorski et al. |
| 6,496,971 B1 | 12/2002 | Lesea et al. |
| 6,504,398 B1 | 1/2003 | Lien et al. |
| 6,513,077 B2 | 1/2003 | Vorbach et al. |
| 6,516,382 B2 | 2/2003 | Manning |
| 6,518,787 B1 | 2/2003 | Allegrucci et al. |
| 6,519,674 B1 | 2/2003 | Lam et al. |
| 6,523,107 B1 | 2/2003 | Stansfield et al. |
| 6,525,678 B1 | 2/2003 | Veenstra et al. |
| 6,526,520 B1 | 2/2003 | Vorbach et al. |
| 6,538,468 B1 | 3/2003 | Moore |
| 6,539,477 B1 | 3/2003 | Seawright |
| 6,542,394 B2 | 4/2003 | Marshall et al. |
| 6,542,844 B1 | 4/2003 | Hanna |
| 6,542,998 B1 | 4/2003 | Vorbach et al. |
| 6,553,395 B2 | 4/2003 | Marshall et al. |
| 6,567,834 B1 | 5/2003 | Marshall et al. |
| 6,571,381 B1 | 5/2003 | Vorbach et al. |
| 6,587,939 B1 | 7/2003 | Takano |
| 6,631,487 B1 | 10/2003 | Abramovici et al. |
| 6,633,181 B1 | 10/2003 | Rupp |
| 6,657,457 B1 | 12/2003 | Hanrahan et al. |
| 6,658,564 B1 | 12/2003 | Smith et al. |
| 6,687,788 B2 | 2/2004 | Vorbach et al. |
| 6,697,979 B1 | 2/2004 | Vorbach et al. |
| 6,704,816 B1 | 3/2004 | Burke |
| 6,708,325 B2 | 3/2004 | Cooke et al. |
| 6,717,436 B2 | 4/2004 | Kress et al. |
| 6,721,830 B2 | 4/2004 | Vorbach et al. |
| 6,728,871 B1 | 4/2004 | Vorbach et al. |
| 6,754,805 B1 | 6/2004 | Juan |
| 6,757,847 B1 | 6/2004 | Farkash et al. |
| 6,757,892 B1 | 6/2004 | Gokhale et al. |
| 6,782,445 B1 | 8/2004 | Olgiati et al. |
| 6,785,826 B1 | 8/2004 | Durham et al. |
| 6,803,787 B1 | 10/2004 | Wicker, Jr. |
| 6,820,188 B2 | 11/2004 | Stansfield et al. |
| 6,847,370 B2 | 1/2005 | Baldwin et al. |
| 6,868,476 B2 | 3/2005 | Rosenbluth et al. |
| 6,871,341 B1 | 3/2005 | Shyr |
| 6,874,108 B1 | 3/2005 | Abramovici et al. |
| 6,886,092 B1 | 4/2005 | Douglass et al. |
| 6,901,502 B2 | 5/2005 | Yano et al. |
| 6,928,523 B2 | 8/2005 | Yamada |
| 6,961,924 B2 | 11/2005 | Bates et al. |
| 6,977,649 B1 | 12/2005 | Baldwin et al. |
| 7,000,161 B1 | 2/2006 | Allen et al. |
| 7,007,096 B1 | 2/2006 | Lisitsa et al. |
| 7,010,667 B2 | 3/2006 | Vorbach et al. |
| 7,038,952 B1 | 5/2006 | Zack et al. |
| 7,210,129 B2 | 4/2007 | May et al. |
| 7,216,204 B2 | 5/2007 | Rosenbluth et al. |
| 7,237,087 B2 | 6/2007 | Vorbach et al. |
| 7,249,351 B1 | 7/2007 | Songer et al. |
| 7,254,649 B2 | 8/2007 | Subramanian et al. |
| 7,340,596 B1 | 3/2008 | Crosland et al. |
| 7,350,178 B1 | 3/2008 | Crosland et al. |
| 2001/0001860 A1 * | 5/2001 | Beiu ......................... 708/620 |
| 2001/0010074 A1 | 7/2001 | Nishihara et al. |
| 2001/0018733 A1 | 8/2001 | Fujii et al. |
| 2001/0032305 A1 | 10/2001 | Barry |
| 2002/0013861 A1 | 1/2002 | Adiletta et al. |
| 2002/0038414 A1 | 3/2002 | Taylor et al. |
| 2002/0045952 A1 | 4/2002 | Blemel |
| 2002/0083308 A1 | 6/2002 | Pereira et al. |
| 2002/0103839 A1 | 8/2002 | Ozawa |
| 2002/0138716 A1 | 9/2002 | Master et al. |
| 2002/0143505 A1 | 10/2002 | Drusinsky |
| 2002/0144229 A1 | 10/2002 | Hanrahan |
| 2002/0165886 A1 | 11/2002 | Lam |
| 2003/0001615 A1 | 1/2003 | Sueyoshi et al. |
| 2003/0014743 A1 | 1/2003 | Cooke et al. |
| 2003/0046607 A1 | 3/2003 | Vorbach |
| 2003/0052711 A1 | 3/2003 | Taylor et al. |
| 2003/0055861 A1 | 3/2003 | Lai et al. |
| 2003/0056085 A1 | 3/2003 | Vorbach |
| 2003/0056091 A1 | 3/2003 | Greenberg |
| 2003/0056202 A1 | 3/2003 | Vorbach |
| 2003/0061542 A1 | 3/2003 | Bates et al. |
| 2003/0062922 A1 | 4/2003 | Douglass et al. |
| 2003/0086300 A1 | 5/2003 | Noyes et al. |
| 2003/0093662 A1 | 5/2003 | Vorbach et al. |
| 2003/0097513 A1 | 5/2003 | Vorbach et al. |
| 2003/0123579 A1 | 7/2003 | Safavi et al. |
| 2003/0135686 A1 | 7/2003 | Vorbach et al. |
| 2003/0192032 A1 | 10/2003 | Andrade et al. |
| 2004/0015899 A1 | 1/2004 | May et al. |
| 2004/0025005 A1 | 2/2004 | Vorbach et al. |
| 2004/0168099 A1 | 8/2004 | Vorbach et al. |
| 2004/0199688 A1 | 10/2004 | Vorbach et al. |
| 2005/0066213 A1 | 3/2005 | Vorbach et al. |
| 2005/0144210 A1 | 6/2005 | Simkins et al. |
| 2005/0144212 A1 | 6/2005 | Simkins et al. |
| 2005/0144215 A1 | 6/2005 | Simkins et al. |

| | | |
|---|---|---|
| 2006/0230094 A1 | 10/2006 | Simkins et al. |
| 2006/0230096 A1 | 10/2006 | Thendean et al. |

FOREIGN PATENT DOCUMENTS

| | | |
|---|---|---|
| DE | 44 16 881 | 11/1994 |
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 6/1986 |
| EP | 0 221 360 | 5/1987 |
| EP | 0 398 552 | 11/1990 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 628 917 | 12/1994 |
| EP | 0 678 985 | 10/1995 |
| EP | 0 686 915 | 12/1995 |
| EP | 0 707 269 | 4/1996 |
| EP | 0 726 532 | 8/1996 |
| EP | 0 735 685 | 10/1996 |
| EP | 0 835 685 | 10/1996 |
| EP | 0 746 106 | 12/1996 |
| EP | 0 748 051 | 12/1996 |
| EP | 0 726 532 | 7/1998 |
| EP | 0 926 594 | 6/1999 |
| EP | 1 102 674 | 7/1999 |
| EP | 1 061 439 | 12/2000 |
| EP | 1 115 204 | 7/2001 |
| EP | 1 146 432 | 10/2001 |
| EP | 0 696 001 | 12/2001 |
| EP | 1 669 885 | 6/2006 |
| FR | 2 752 466 | 2/1998 |
| GB | 2 304 438 | 3/1997 |
| JP | 58-58672 | 4/1983 |
| JP | 2-130023 | 5/1990 |
| JP | 2-226423 | 9/1990 |
| JP | 5-276007 | 10/1993 |
| JP | 7-154242 | 6/1995 |
| JP | 8-44581 | 2/1996 |
| JP | 08069447 | 3/1996 |
| JP | 8-250685 | 9/1996 |
| JP | 9-27745 | 1/1997 |
| JP | 11-3077725 | 11/1999 |
| JP | 2000-076066 | 3/2000 |
| JP | 2000-181566 | 6/2000 |
| JP | 2000-201066 | 7/2000 |
| JP | 2000-311156 | 11/2000 |
| JP | 2001-500682 | 1/2001 |
| WO | WO90/04835 | 5/1990 |
| WO | WO90/11648 | 10/1990 |
| WO | WO92/01987 | 2/1992 |
| WO | WO93/11503 | 6/1993 |
| WO | WO94/08399 | 4/1994 |
| WO | WO94/06077 | 5/1994 |
| WO | WO95/00161 | 1/1995 |
| WO | WO95/26001 | 9/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35299 | 8/1998 |
| WO | WO99/00731 | 1/1999 |
| WO | WO99/00739 | 1/1999 |
| WO | WO 99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | 00/45282 | 8/2000 |
| WO | WO00/49496 | 8/2000 |
| WO | WO00/77652 | 12/2000 |
| WO | WO 01/55917 | 8/2001 |
| WO | WO02/13000 | 2/2002 |
| WO | WO02/21010 | 3/2002 |
| WO | WO02/29600 | 4/2002 |
| WO | WO02/50665 | 6/2002 |
| WO | WO02/071196 | 9/2002 |
| WO | WO02/071248 | 9/2002 |
| WO | WO02/071249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/032975 | 4/2003 |
| WO | WO03/036507 | 5/2003 |
| WO | WO 2004/053718 | 6/2004 |
| WO | WO2004/114128 | 12/2004 |
| WO | WO2005/045692 | 3/2005 |

OTHER PUBLICATIONS

Alippi, C., et al., Determining the Optimum Extended Instruction Set Architecture for Application Specific Reconfigurable VLIW CPUs, IEEE., 2001, pp. 50-56, month unknown.

Arabi et al., "PLD Integrates Dedicated High-speed Data Buffering, Complex State Machine, and Fast Decode Array," conference record on WESCON '93, Sep. 28, 1993, pp. 432-436.

Athanas P. "A Functional Reconfigurable Architecture and Compiler for Adoptive Computing," , IEEE, pp. 49-55, date unk.

Athanas, P. et al., "An Adaptive Hardware Machine Architecture and Compiler for Dynamic Processor Reconfiguration", IEEE, Laboratory for Engineering Man/Machine Systems Division of Engineering, Box D, Brown University Providence, Rhode Island, 1991, pp. 397-400, month unknown.

Athanas, P. et al., "Quantitative analysis of floating point arithmetic on FPGA based custom computing machines," IEEE Symposium on FPGAs For Custom Computing Machines, *IEEE Computer Society Press*, Apr. 19-21, 1995, pp. i-vii, 1-222.

Baumgarte, V., et al., PACT XPP "A Self-reconfigurable Data Processing Architecture," PACT Info. GMBH, Munchen Germany 2001, month unknown.

Becker, J. et al., "Parallelization in Co-compilation for Configurable Accelerators—a Host/accelerator Partitioning Compilation Method," proceedings of Asia and South Pacific Design Automation Conference, Yokohama, Japan, Feb. 10-13, 1998.

Bittner, R. A. Jr., "Wormhole Run-time Reconfiguration: Conceptualization and VLSI Design of a High Performance Computing System," *Dissertation*, Jan. 23, 1997, pp. I-XX, 1-415.

Cadambi et al., "Managing Pipeline-reconfigurable FPGAs," ACM, 1998, pp. 55-64, month unknown.

Callahan, T. et al. "The Garp Architerchture and C Copiler," Computer, Apr. 2000, pp. 62-69.

Cardoso, J.M.P., "Compilation of Java™ Algorithms onto Reconfigurable Computing Systems with Exploitation of Operation-Level Parallelism," Ph.D. Thesis, Universidade Tecnica de Lisboa (UTL), Lisbon, Portugal Oct. 2000 (English Abstract included).

Diniz, P. et al., "Automatic Synthesis of Data Storage and Control Structures for FPGA-based Computing Engines", 2000, IEEE, pp. 91-100, month unknown.

Donandt, J. "Improving Response Time of Programmable Logic Controllers by Use of a Boolean Coprocessor", AEG Research Institute Berlin, IEEE, 1989, pp. 4-167-4-169, month unknown.

Dutt, N. et al., If Software is King for Systems-on-Silicon, What's New in Compiler?, IEEE., 1997, pp. 322-325, month unk.

Ferrante J. et al., "The Program Dependence Graph and its Use in Optimization ACM Transactions on Programming Languages and Systems," Jul. 1987, USA, [online] Bd. 9, Nr., 3, pp. 319-349, XP002156651 ISSN: 0164-0935 ACM Digital Library.

Fineberg, S. et al., "Experimental Analysis of a Mixed-Mode Parallel Architecture Using Bitonic Sequence Sorting", vol. 11. No. 3, Mar. 1991, pp. 239-251.

Fornaciari, W. Et al., System-level power evaluation metrics, 1997 Proceedings of the 2nd Annual IEEE International Conference on Innovative Systems in Silicon, New York, NY, Oct. 1997, pp. 323-330.

Forstner, P. "Wer Zuerst Kommt, Mahlt Zuerst!: Teil 3: Einsatzgebiete und Anwendungsbeispiele von FIFO-Speichern", Elektronik, Aug. 2000, pp. 104-109.

Gokhale, M. B. et al., "Automatic Allocation of Arrays to Memories in FPGA processors with Multiple Memory Banks", Field-Programmable Custom Computing Machines, 1999, IEEE, pp. 63-67, month unknown.

Hammes, J. et al., "Cameron: High Level Language Compilation for Reconfigurable Systems," Department of Computer Science, Colorado State University, Conference on Parallel Architecures and Compilation Techniques, Oct. 12-16, 1999.

Hauck "The Roles of FPGA's in Reprogrammable Systems," IEEE, Apr. 1998, pp. 615-638.

Hauser, J.R. et al., "Garp: A MIPS Processor with a Reconfigurable Coprocessor", University of California, Berkeley, IEEE, 1997, pp. 12-21, month unknown.

Hedge, S.J., 3D WASP Devices for On-line Signal and Data Processing, 1994, International Conference on Wafer Scale Integration, pp. 11-21, month unknown.

Hong Yu Xu et al., "Parallel QR Factorization on a Block Data Flow Architecture" Conference Proceeding Article, Mar. 1, 1992, pp. 332-336 XPO10255276, p. 333, Abstract 2.2, 2.3, 2.4-p. 334.

Hwang, L. et al., "Min-cut Replication in Partitioned Networks" IEEE Transactions on Computer-Aided Design of Integrated Circuits and Systems, [online] Bd. 14, Nr. 1, Jan. 1995; pp. 96-106, XP00053228 USA ISSN: 0278-0070 IEEE Xplore.

Iseli, C., et al. "A C++ Compiler for FPGA Custom Execution Units Synthesis," IEEE. 1995, pp. 173-179, month unknown.

Isshiki, Tsuyoshi et al., "Bit-Serial Pipeline Synthesis for Multi-FPGA Systems with C++ Design Capture," 1996 IEEE, pp. 38-47, month unknown.

Jacob, J. et al., "Memory Interfacing and Instruction Specification for Reconfigurable Processors", ACM 1999, pp. 145-154, month unknown.

Jantsch, Axel et al., "A Case Study on Hardware/software Partitioning," Royal Institute of Technology, Kista, Sweden, Apr. 10, 1994 IEEE, pp. 111-118.

John, L. et al., "A Dynamically Reconfigurable Interconnect for Array Processors", vol. 6, No. 1, Mar. 1998, IEEE, pp. 150-157.

Koch, A. et al., "Practical Experiences with the SPARXIL Co-Processor", 1998, IEEE, pp. 394-398, month unknown.

Kung, "Deadlock Avoidance for Systolic Communication", 1988 Conference Proceedings of 15$^{th}$ Annual International Symposium on Computer Architecture, May 30, 1988, pp. 252-260.

Ling, X., "WASMII: An MPLD with Data-Driven Control on a Virtual Hardware," Journal of Supercomputing, Kluwer Acdemic Publishers, Dordrecht, Netherlands, 1995, pp. 253-276, month unknown.

Mano, M. Morris "Digital Design," by Prentice Hall, Inc., Englewood Cliffs, New Jersey 07632, 1984, pp. 119-125, 154-161, month unknown.

Maxfield, C. "Logic that Mutates While-U-Wait" EDN (Bur. Ed) (USA), EDN (European Edition), Nov. 7, 1996, Cahners Publishing, USA.

Miller, M. J. et al., "High-Speed FIFOs Contend with Widely Differing Data Rates: Dual-port RAM Buffer and Dual-pointer System Provide Rapid, High-density Data Storage and Reduce Overhead", Computer Design, Sep. 1, 1985, pp. 83-86.

Mirsky, E. DeHon, "MATRIX: A Reconfigurable Computing Architecture with Configurable Instruction Distribution and Deployable Resources," Proceedings of the IEEE Symposium on FPGAs for Custom Computing Machines, 1996, pp. 157-1666, month unknown.

Myers, G. "Advances in Computer Architecture," Wiley-Interscience Publication, 2nd ed., John Wiley & Sons, Inc. pp. 463-494, 1978, month unknown.

Nilsson et al., "The Scalable Tree Protocol—A Cache Coherence Approaches for Large-Scale Multiprocessors" IEEE, pp. 498-506 Dec. 1992.

Norman, R. S., "Hyperchip Business Summary, The Opportunity," Jan. 31, 2000, pp. 1-3.

Piotrowski, A. "IEC-BUS, Die Funktionsweise des IEC-Bus und seine Anwendung in Geräten und Systemen", 1987, Franzis-Verlag GmbH, München, pp. 20-25, month unknown.

Saleeba. M, "A Self-Contained Dynamically Reconfigurable Processor Architecture," Sixteenth Australian Computer Science Conference, ASCS-16, QLD, Australia, Feb. 1993.

Schmit, H. Et al., Hidden Markov Modeling and Fuzzy Controllers in FPGAs, FPGAs for Custom Computing Machines, 1995; Proceedings, IEEE Symposium on Napa Valley, CA, Apr. 1995, pp. 214-221.

Siemers C. "Rechenfabrik Ansaetze Fuer Extrem Parallele Prozessoren", Verlag Heinze Heise GmbH., Hannover, DE No. 15, Jul. 16, 2001, pp. 170-179.

Simunic, T. Et al., Source Code Optimization and Profiling of Energy Consumation in Embedded Systems, Proceedings of the 13th International Symposium on System Synthesis, Sep. 2000, pp. 193-198.

Tau, E. et al., "A First Generation DPGA Implementation," *FPD'95*, pp. 138-143, month unknown.

Tenca, A. F.. et al., "A Variable Long-Precision Arithmeitc Unit Design for Reconfigurable Coprocessor Architectures", University of California, Los Angeles, 1998, pp. 216-225, month unknown.

The XPP White Paper, Release 2.1, PACT—A Technical Perspective, Mar. 27, 2002, pp. 1-27.

TMS320C54X DSP: CPU and Peripherals, Texas Instruments, 1996, pp. 6-26 to 6-46, month unknown.

TMS320C54x DSP: Mnemonic Instruction Set, Texas Instruments, 1996, p. 4-64, month unknown.

Villasenor, J. et al., "Configurable Computing Solutions for Automatic Target Recognition," *IEEE*, 1996 pp. 70-79, month unk.

Villasenor, J. et al., "Configurable Computing," *Scientific American*, vol. 276, No. 6, Jun. 1997, pp. 66-71.

Villasensor, J. et al., "Express Letters Video Communications Using Rapidly Reconfigurable Hardware," IEEE Transactions on Circuits and Systems for Video Technology, IEEE, Inc. NY, Dec. 1995, pp. 565-567.

Wada K. et al., "A Performance Evaluation of Tree-based Coherent Distributed Shared Memory" Proceedings of the Pacific RIM Conference on Communications, Comput and Signal Processing, Victoria, May 19-21, 1993.

Weinhardt, M. "Ubersetzingsmethoden fur strukturprogrammierbare rechner ," Dissertation for Doktors der Ingenieurwissenschaften der Universitat Karlsruhe: Jul. 1, 1997 [Weinhardt, M. "Compilation Methods for Structure-programmable Computers", dissertation, ISBN 3-89722-011-3, 1997].

Weinhardt, M. et al., "Pipeline Vectorization for Reconfigurable Systems", 1999, IEEE, pp. 52-60, month unknown.

Witfig et al., "OneChip: An FPGA Processor with Reconfigurable Logic" IEEE, 1996 pp. 126-135, month unknown.

Wu et al., "A New Cache Directory Scheme", IEEE, pp. 466-472, Jun. 1996.

XLINX, "Logic Cell Array Families: XC4000, XC4000A and XC4000H" , product description, pp. 2-7 to 2-15, Additional XC3000, XC31000 and XC3100A Data, pp. 8-16 and 9-14, date unknown.

Ye, Z.A. et al., "A Compiler for a Processor With A Reconfigurable Functional Unit," FPGA 2000 ACM/SIGNA International Symposium on Field Programmable Gate Arrays, Monterey, CA Feb. 9-11, 2000, pp. 95-100.

Zhang, N. Et al., Architectural Evaluation of Flexible Digital Signal Processing for Wireless Receivers, Signals, Systems and Computers, 2000; Conference Record of the Thirty-Fourth Asilomar Conference, Bd.1, Oct. 29, 2000, pp. 78-83.

Baumgarte, V., et al., PACT XPP "A Self-reconfigurable Data Processing Architecture," PACT Info. GMBH, Munchen Germany, 2001, 7 pages, month unknown.

Beck et al., "From control flow to data flow," TR 89-1050, Oct. 1989, Dept. of Computer Science, Cornell University, Ithaca, NY, pp. 1-25.

Becker, J. et al., "Parallelization in Co-compilation for Configurable Accelerators—a Host/accelerator Partitioning Compilation Method," proceedings of Asia and South Pacific Design Automation Conference, Yokohama, Japan, Feb. 10-13, 1998, 11 pages.

Cardoso, J.M.P., "Compilation of Java™ Algorithms onto Reconfigurable Computing Systems with Exploitation of Operation-Level Parallelism," Ph.D. Thesis, Universidade Tecnica de Lisboa (UTL), Lisbon, Portugal Oct. 2000 (Table of Contents and English Abstract only).

Hammes, Jeff et al., "Cameron: High Level Language Compilation for Reconfigurable Systems," Department of Computer Science, Colorado State University, Conference on Parallel Architectures and Compilation Techniques, Oct. 12-16, 1999, 9 pages.

Hauser, J.R. et al., "Garp: A MIPS Processor with a Reconfigurable Coprocessor", University of California, Berkeley, IEEE, 1997, pp. 24-33, month unknown.

Ling et al., "WASMII: An MPLD with Data-Driven Control on a Virtual Hardware," Journal of Supercomputing, Kluwer Academic Publishers, Dordrecht, Netherlands, 1995, pp. 253-276, month unknown.

Abnous, A., et al., "The Pleiades Architecture," Chapter I of *The Application of Programmable DSPs in Mobile Communications*, A. Gatherer and A. Auslander, Ed., Wiley, 2002, pp. 1-33, month unknown.

Cardoso, Joao M.P. and Markus Weinhardt, "XPP-VC: A C Compiler with Temporal Partitioning for the PACT-XPP Architecture," Field-Programmable Logic and Applications. Reconfigurable Computing is Going Mainstream, 12$^{th}$ International Conference FPL 2002, Proceedings (Lecture Notes in Computer Science, vol. 2438) Springer-Verlag Berlin, Germany, 2002, pp. 864-874, month unknown.

Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.

DeHon, A., "DPGA Utilization and Application," MIT Artificial Intelligence Laboratory, Proceedings of the Fourth International ACM Symposium on Field-Programmable Gate Arrays (FPGA '96), IEEE Computer Society, pp. 1-7, month unknown.

Franklin, Manoj et al., "A Fill-Unit Approach to Multiple Instruction Issue," Proceedings of the Annual International Symposium on Microarchitecture, Nov. 1994, pp. 162-171.

Hartenstein, R., "Coarse gain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.

Hastie et al., "The implementation of hardware subroutines on field programmable gate arrays," Custom Integrated Circuits Conference, 1990, Proceedings of the IEEE 1990, May 16, 1990, pp. 31.3.1-31.4.3 (3 pages).

Kastrup, B., "Automatic Hardware Synthesis for a Hybrid Reconfigurable CPU Featuring Philips CPLDs," Proceedings of the PACT Workshop on Reconfigurable Computing, 1998, pp. 5-10, month unknown.

Koren et al., "A data-driven VLSI array for arbitrary algorithms," IEEE Computer Society, Long Beach, CA vol. 21, No. 10, Oct. 1, 1988, pp. 30-34.

Lee, Jong-eun et al., "Reconfigurable ALU Array Architecture with Conditional Execution," International Soc. Design Conference (ISOOC) [online] Oct. 25, 2004, Seoul, Korea, 5 pages.

Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.

Razdan et al., A High-Performance Microarchitecture with Hardware-Programmable Functional Units, Micro-27, Proceedings of the 27$^{th}$ Annual International Symposium on Microarchitecture, IEEE Computer Society and Association for Computing Machinery, Nov. 30-Dec. 2, 1994, pp. 172-180.

Siemers et al., "The .>S<puter: A Novel Microarchitecture Mode for Execution inside Superscalar and VLIW Processors Using Reconfigurable Hardware," Australian Computer Science Communications, vol. 20, No. 4, Computer Architecture, Proceedings of the 3$^{rd}$ Australian Computer Architecture Conference, Perth, John Morris, Ed., Feb. 2-3, 1998, pp. 169-178.

Skokan, Z.E., "Programmable logic machine (A programmable cell array)," IEEE Journal of Solid-State Circuits, vol. 18, Issue 5, Oct. 1983, pp. 572-578.

Weinhardt, M., "Compilation Methods for Structure-programmable Computers," dissertation, ISBN 3-89722-011-3, 1997. [Table of Contents and English Abstract Provided], month unknown.

Xilinx, "Spartan and SpartanXL Families Field Programmable Gate Arrays," Jan. 1999, Xilinx, pp. 4-3 through 4-70.

Yeung, A. et al., "A data-driven architecture for rapid prototyping of high throughput DSP algorithms," Dept. of Electrical Engineering and Computer Sciences, Univ. of California, Berkeley, USA, *Proceedings VLSI Signal Processing Workshop, IEEE Press*, pp. 225-234, Napa, Oct. 1992.

Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, *IEEE* 1993, month unknown.

Zhang, et al., Architectural Evaluation of Flexible Digital Signal Processing for Wireless Receivers, Signals, Systems and Computers, 2000; Conference Record of the Thirty-Fourth Asilomar Conference, Bd. 1, Oct. 29, 2000, pp. 78-83.

Abnous, A. et al., "Ultra-Low-Power Domain-Specific Multimedia Processors," U.C. Berkeley, 1996 IEEE, pp. 461-470.

Sutton et al., "a Multiprocessor DSP System Using PADDI-2," U.C. Berkeley, 1998 ACM, pp. 62-65.

Zhang, et al., "Abstract: Low-Power Heterogeneous Reconfigurable Digital Signal Processors with Energy-Efficient Interconnect Network," U.C. Berkeley 2004, pp. 1-120.

Zhang, et al., "A 1-V Heterogeneous Reconfigurable DSP IC for Wireless Baseband Digital Signal Processing," IEEE Journal of Solid-State Circuits, vol. 35, No. 11, Nov. 2000, pp. 1697-1704.

Baumgarte, V., et al., PACT XPP "A Self-reconfigurable Data Processing Architecture," PACT Info. GMBH, Munchen Germany, 2001, 7 pages, no month.

Hauser, J.R. et al., "Garp: A MIPS Processor with a Reconfigurable Coprocessor", University of California, Berkeley, IEEE, 1997, pp. 24-33, no month.

Ling et al., "WASMII: An MPLD with Data-Driven Control on a Virtual Hardware," Journal of Supercomputing, Kluwer Academic Publishers, Dordrecht, Netherlands, 1995, pp. 253-276, no month.

Maxfield, C., "Logic That Mutates While-U-Wait," EDN (Bur. Ed.) USA, EDN (European Edition), Nov. 7, 1996, Cahners Publishing, USA, pp. 137-140, 142.

Myers, G. "Advances in Computer Architecture," Wiley-Interscience Publication, 2nd ed., John Wiley & Sons, Inc., 1978, pp. 463-494, no month.

Mirsky, E. et al, "MATRIX: A Reconfigurable Computing Architecture with Configurable Instruction Distribution and Deployable Resources," Proceedings of the IEEE Symposium on FPGAs for Custom Computing Machines, 1996, pp. 157-166, no month.

Shirazi, et al., "Quantitative analysis of floating point arithmetic on FPGA based custom computing machines," IEEE Symposium on FPGAs for Custom Computing Machines, *IEEE Computer Society Press*, Apr. 19-21, 1995, pp. 155-162.

Sueyoshi, T, "Present Status and Problems of the Reconfigurable Computing Systems Toward the Computer Evolution," Department of Artificial Intelligence, Kyushi Institute of Technology, Fukuoka, Japan; Institute of Electronics, Information and Communication Engineers, vol. 96, No. 426, IEICE Technical Report (1996), pp. 111-119 [English Abstract Only], no month.

Wada et al., "A Performance Evaluation of Tree-based Coherent Distributed Shared Memory" Proceedings of the Pacific RIM Conference on Communications, Comput and Signal Processing, Victoria, May 19-21, 1993, pp. 390-393.

Weinhardt, Markus et al., "Pipeline Vectorization," IEEE Transactions on Computer-Aided Design of Integrated Circuits and Systems, vol. 20, No. 2, Feb. 2001, pp. 234-248.

Xilinx, "Logic Cell Array Families: XC4000, XC4000A and XC4000H," product description, pp. 2-7, 2-9, 2-14, 2-15, 8-16, and 9-14, date unknown.

Altera, "Flex 10K Embedded Programmable Logic Device Family," Altera Corporation product description, Jan. 2003, pp. 1-128.

Atmel, 5-K-50K Gates Coprocessor FPGA with Free Ram, Data Sheet, Jul. 2006, 55 pages.

Atmel, FPGA-based FIR Filter Application Note, Sep. 1999, 10 pages.

Atmel, "An Introduction to DSP Applications using the AT40K FPGA," FPGA Application Engineering, San Jose, CA, Apr. 2004, 15 pages.

Atmel, Configurable Logic Design & Application Book, Atmel Corporation, 1995, pp. 2-19 through 2-25, month unknown.

Atmel, Field Programmable Gate Array Configuration Guide, AT6000 Series Configuration Data Sheet, Sep. 1999, pp. 1-20.

Athanas et al., "Processor Reconfiguration Through Instruction-Set Metamorphosis," 1993, IEEE Computers, pp. 11-18, month unknown.

Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125, month unknown.

Bacon, D. et al., "Compiler Transformations for High-Performance Computing," ACM Computing Surveys, 26(4):346-420 (1994) Dec. 1994.

Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003).

Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002).

Bratt, A, "Motorola field programmable analogue arrays, present hardware and future trends," Motorola Programmable Technology Centre, Gadbrook Business Centre, Northwich, Cheshire, 1998, The Institute of Electrical Engineers, IEE. Savoy Place, London, pp. 1-5, month unknown.

Cardoso, J.M.P. et al., "A novel algorithm combining temporal partitioning and sharing of functional units," University of Algarve, Faro, Portugal, 2001 IEEE, pp. 1-10, month unknown.

Clearspeed, CSX Processor Architecture, Whitepaper, PN-1110-0702, 2007, pp. 1-15, www.clearspeed.com, month unknown.

Clearspeed, CSX Processor Architecture, Whitepaper, PN-1110-0306, 2006, pp. 1-14, www.clearspeed.com, month unknown.

Compton, K. et al., "Configurable Computing: A Survey of Systems and Software," Northwestern University, Dept. Of ECE, Technical Report, 1999, (XP-002315148), 39 pages, month unknown.

Cronquist, D. et al., Architecture Design of Reconfigurable Pipelined Datapaths, Department of Computer Science and Engineering, University of Washington, Seattle, WA, Proceedings of the 20$^{th}$ Anniversary Conference on Advanced Research in VSLI, 1999, pp. 1-15, month unknown.

DeHon, Andre, "Reconfigurable Architectures for General-Purpose Computing," Massachusetts Institute of Technology, Technical Report AITR-1586, Oct. 1996(Oct. 1996), XP002445054, Cambridge, MA, pp. 1-353.

Diniz, P., et al., "A behavioral synthesis estimation interface for configurable computing," University of Southern California, Marina Del Rey, CA, 2001 IEEE, pp. 1-2, month unknown.

Ebeling, C. et al., "Mapping Applications to the RaPiD Configurable Architecture," Department of Computer Science and Engineering, University of Washington, Seattle, WA, *FPGAs for Custom Computing Machines, 1997. Proceedings., The 5th Annual IEEE Symposium*, Publication Date: Apr. 16-18, 1997, 10 pages.

Equator, Pixels to Packets, Enabling Multi-Format High Definition Video, Equator Technologies BSP-15 Product Brief, www.equator.com 2001, 4 pages, month unknown.

Freescale Slide Presentation, An Introduction to Motorola's RCF (Reconfigurable Compute Fabric) Technology, Presented by Frank David, Launched by Freescale Semiconductor, Inc., 2004, 39 pages, month unknown.

Genius, D. et al., "A Case for Array Merging in Memory Hierarchies," Proceedings of the 9th International Workshop on Compilers for Parallel Computers, CPC'01 (Jun. 2001), 10 pages.

Hartenstein, R. et al., "A new FPGA architecture for word-oriented datapaths," Proc. FPL'94, Springer LNCS, Sep. 1994, pp. 144-155.

Hartenstein, R., "Coarse grain reconfigurable architectures," Design Automation Conference, 2001, Proceedings of the ASP-DAC 2001 Asia and South Pacific, Jan. 30- Feb. 2, 2001, IEEE Jan. 30, 2001, pp. 564-569.

Hwang, K., "Advanced Computer Architecture—Parallelism, Scalability, Programmability," 1993, McGraw-Hill, Inc., pp. 348-355, month unknown.

IBM Technical Disclosure Bulletin, IBM Corp., New York, XP000424878, Bd. 36, Nr. 11, Nov. 1, 1993, pp. 335-336.

Inside DSP, "Ambric Discloses Massively Parallel Architecture," Aug. 23, 2006, HTTP://insidedsp.com/tabid/64/articleType/ArticleView/articleId/155/Defa . . . , 2 pages.

Intel, Intel MXP5800/MXP5400 Digital Media Processors, Architecture Overview, Jun. 2004, Revision 2.4, pp. 1-24.

Kaul, M., et al., "An automated temporal partitioning and loop fission approach of FPGA based reconfigurable synthesis of DSP applications," University of Cincinnati, Cincinnati, OH ACM 1999, pp. 616-622, month unknown.

Kean, T.A., "Configurable Logic: A Dynamically Programmable Cellular Architecture and its VLSI Implementation," University of Edinburgh (Dissertation) 1988, pp. 1-286, month unknown.

Kean, T., et al., "A Fast Constant Coefficient Multiplier for the XC6200," Xilinx, Inc., Lecture Notes in Computer Science, vol. 1142, Proceedings of the 6$^{th}$ International Workshop of Field-Programmable Logic, 1996, 7 pages, month unknown.

Kim et al., "A Reconfigurable Multifunction Computing Cache Architecture," IEEE Transactions on Very Large Scale Integration (VLSI) Systems vol. 9, Issue 4, Aug. 2001 pp.509-523.

Knittel, Gunter, "A PCI-compatible FPGA-Coprocessor for 2D/3D Image Processing," University of Turgingen, Germany, 1996 IEEE, pp. 136-145, month unknown.

Larsen, S. et al., "Increasing and Detecting Memory Address Congruence," Proceedings of the 2002 IEEE International Conference on Parallel Architectures and Compilation Techniques (PACT'02), pp. 1-12 (Sep. 2002).

Lee et al., "A new distribution network based on controlled switching elements and its applications," IEEE/ACT Trans. Of Networking, vol. 3, No. 1, pp. 70-81, Feb. 1995.

Margolus, N., "An FPGA architecture for DRAM-based systolic computations," Boston University Center for Computational Science and MIT Artificial Intelligence Laboratory, IEEE 1997, pp. 2-11, month unknown.

Mei, Bingfeng, "A Coarse-Grained Reconligurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).

Mei, Bingfeng, et al., "Design and Optimization of Dynamically Reconfigurable Embedded Systems," IMEC vzw, 2003, Belgium, 7 pages, http://www.imec.be/reconfigurable/pdf/ICERSA_01_design.pdf, month unknown.

Miyamori, T. et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25, 1998, Monterey, California, United States, pp. 1-12.

Muchnick, S., "Advanced Compiler Design and Implementation" (Morgan Kaufmann 1997), Table of Contents, 11 pages, month unknown.

Murphy, C., "Virtual Hardware Using Dynamic Reconfigurable Field Programmable Gate Arrays," Engineering Development Centre, Liverpool John Moores University, UK, GERI Annual Research Symposium 2005, 8 pages, month unknown.

Nageldinger, U., "Design-Space Exploration for Coarse Grained Reconfigurable Architectures," (Dissertation) Universitaet Kaiserslautern, 2000, Chapter 2, pp. 19-45, month unknown.

Olukotun, K., "The Case for a Single-Chip Microprocessor," ACM Sigplan Notices, ACM, Association for Computing Machinery, New York, vol. 31, No. 9, Sep. 1996 pp. 2-11.

PACT Corporation, "The XPP Communication System," Technical Report 15, pp. 1-16, Nov. 25, 2008.

Parhami, B., "Parallel Counters for Signed Binary Signals," Signals, Systems and Computers, 1989, Twenty-Third Asilomar Conference, vol. 1, pp. 513-516, month unknown.

Quenot, G.M., et al., "A Reconfigurable Compute Engine for Real-Time Vision Automata Prototyping," Laboratoire Systeme de Perception, DGA/Etablissement Technique Central de l'Armement, France, 1994 IEEE, pp. 91-100, month unknown.

Saleeba, Z.M.G., "A Self-Reconfiguring Computer System," Department of Computer Science, Monash University (Dissertation) 1998, pp. 1-306, month unknown.

Schmidt, H. et al., "Behavioral synthesis for FPGA-based computing," Carnegie Mellon University, Pittsburgh, PA, 1994 IEEE, pp. 125-132, month unknown.

Singh, H. et al., "MorphoSys: An Integrated Reconfigurable System for Data-Parallel Computation-Intensive Applications," University of California, Irvine, CA. and Federal University of Rio de Janeiro, Brazil, 2000, IEEE Transactions on Computers, pp. 1-35, month unknown.

Soni, M., "VLSI Implementation of a Wormhole Run-time Reconfigurable Processor," Jun. 2001, (Masters Thesis)Virginia Polytechnic Institute and State University, 88 pages.

Tsutsui, A., et al., "YARDS: FPGA/MPU Hybrid Architecture for Telecommunication Data Processing," NTT Optical Network Systems Laboratories, Japan, 1997 ACM, pp. 93-99, month unknown.

Vasell et al., "The Function Processor: A Data-Driven Processor Array for Irregular Computations," Chalmers University of Technology, Sweden, pp. 1-21, month unknown.

Waingold, E., et al., "Baring it all to software: Raw machines," IEEE Computer, Sep. 1997, at 86-93.

Weinhardt, Markus et al., "Memory Access Optimization for Reconfigurable Systems," IEEE Proceedings Computers and Digital Techniques, 48(3) (May 2001) pp. 1-16.

Wolfe, M. et al., "High Performance Compilers for Parallel Computing" (Addison-Wesley 1996) Table of Contents, 11 pages, month unknown.

XILINX, "XC6200 Field Programmable Gate Arrays," Apr. 24, 1997, Xilinx product description, pp. 1-73.

XILINX, "XC3000 Series Field Programmable Gate Arrays," Nov. 9, 1998, Xilinx product description, pp. 1-76.

XILINX, "XC4000E and XC4000X Series Field Programmable Gate Arrays," May 14, 1999, Xilinx product description, pp. 1-68.

XILINX, "Virtex-E 1.8 V Extended Memory Field Programmable Gate Arrays," Jul. 17, 2002, Xilinx Production Product Specification, pp. 1-118.

XILINX, "Virtex-II and Virtex-II Pro X FPGA User Guide," Mar. 28, 2007, Xilinx user guide, pp. 1-559.

Zima, H. et al., "Supercompilers for parallel and vector computers" (Addison-Wesley 1991) Table of Contents, 5 pages, month unknown.

Asari, et al., "FeRAM circuit technology for system on a chip," *Proceedings First NASA/DoD Workshop on Evolvable Hardware*, pp. 193-197 (1999).

Lee, et al., "Multimedia extensions for general-purpose processors," *IEEE Workshop on Signal Processing Systems, SIPS 97—Design and Implementation*, pp. 9-23 (1997), no date.

Pirsch, et al., "VLSI implementations of image and video multimedia processing systems," *IEEE Transactions on Circuits and Systems for Video Technology* 8(7): 878-891 (Nov. 1998).

Salefski, et al., "Re-configurable computing in wireless," *Annual ACM IEEE Design Automation Conference: Proceedings of the 38$^{th}$ conference on Design automation*, pp. 178-183 (2001), no date.

Schmidt, et al., "Datawave: A Single-Chip Multiprocessor for Video Applications," *IEEE Micro* 11(3): 22-25 and 88-94 (Jun. 1991).

* cited by examiner

LOGIC CELL ARRAY AND BUS SYSTEM

FIELD OF THE INVENTION

The present invention relates to logic cell arrays.

BACKGROUND INFORMATION

Logic cell arrays, such as, for example, reconfigurable logic cell arrays include, as particular types, systolic arrays, neuronal networks, multi-processor systems, processors having a number of arithmetic-logic units, and/or logic cells and/or communicative/peripheral cells (I/O), networking and/or network chips, such as crossbar switches, as well as FPGA, DPGA, Xputer, Chameleon chips, etc. The following patents commonly assigned to the assignee of the present application describe logic cell arrays and are incorporated by reference in their entirety: German Patent No. 44 16 881; German Patent No. 197 81 412; German Patent No. 197 81 483; German Patent No. 196 54 846, German Patent No. 196 54 593; German Patent No. 197 04 044; German Patent No. 198 80 129, German Patent No. 198 61 088, German Patent No. 199 80 312; International Patent Application No. PCT/DE 00/01869; German Patent No. 100 36 627, German Patent No. 100 28 397, German Patent No. 101 10 530, German Patent No. 101 11 014, International Patent Application No. PCT/EP 00/10516, and European Patent No. 01 102 674. According to their wide variety, logic cells are herein defined as any cells that contain logic, arithmetic, switches, memory, or peripherals.

In systems such as those previously cited, there are approaches that enable in efficient processing of data which may be implemented in hardware architectures. There nevertheless exists in practical implementations the need to optimize designs, which, in particular, can be structured in a space-saving manner on a wafer and/or can be operated in an energy-saving manner. Additionally, it is desirable to find especially advantageous kinds of operation.

One of the difficulties with conventional systems is that a large number of cells have to communicate with each other. The communication may be required in order to pass the data to be processed from one cell to another. This is the case, for example, if a cell is supposed to further process the results from another cell, e.g., by linking of the result obtained there to results obtained from one or more other cells. Furthermore, communication may be required to transmit status signals.

Busses for transmitting signals to one of a number of possible receivers have been used in this context. Busses are bundles of wires, the number of wires typically being determined from the number of bits to be transmitted together, that is, typically in parallel, plus in some cases a series of status lines.

With conventional simple busses, as are used, for example, in PC's for the communication of plug-in boards with the CPU and/or with each other, the bus lines may be routed to all receivers, and then appropriate control signals transmitted along with them, that is, addressing, ensures that only those receivers respond that are supposed to receive the data. Such a system becomes problematic when a great many communicating units need access to the bus or busses. This is because the communication of data must wait, if necessary, until the bus has been released by other units and/or time-slice solutions must be implemented that grant a transmitting unit only a certain transmission time, which as a rule is independent of whether all data has been transmitted in this time, which might also make it necessary to use a number of time slices for the data transmission. For example, this approach is practiced in systems like the token ring network. In systems like logic cell arrays, in which very rapid communication is desired in order to ensure high data processing speeds, this is an undesirable solution.

It has also been proposed that the busses be segmented. If, for example, in a series of logic cells several units to be connected to each other are disposed close together in pairs, a bus line that passes along all units and consequently is long may be separated by means of switches in order to form several subbus systems. In this context, each segment, like the entire bus, comprises the required number of parallel data lines and the additionally required protocol lines; the communication of a pair of logic cells that are disposed close together does not disrupt the communication of another pair that are disposed close together. In this way, the data rate that is transmitted via the bus system may be substantially increased.

However, this system may not work well when integrated on semiconductor chips, such as in CMOS technology, where the structure is typically complex and the operation is energy inefficient.

SUMMARY

According to example embodiments of the present invention, in a logic cell array having a number of logic cells and a segmented bus system for logic cell communication, the bus system includes different segment lines having shorter and longer segments for connecting two points in order to be able to minimize the number of bus elements traversed between separate communication start and end points.

By configuring the busses using segments of great length that are fashioned as a single line for bypassing long paths in a logic cell array, an especially simple design and an especially efficient operation result. By simultaneously providing short segment lines, it is ensured that all points are addressable as needed.

Each of the segment lines may be formed of a plurality of parallel lines whose number is determined by the bus width and/or the bus protocol. Each segment is therefore formed by a bundle of parallel lines. All lines of a segment may have the same length, so that the lines of a line bundle may all be routed to one and the same end point line, such as a data input of a logic cell, where they may be connected to the input members that are assigned to each of their bits.

According to one example embodiment, data conversion logic cells like arithmetic units have three of the line bundles that are required for the processed bit width to be supplied to them as data supply lines. This permits carrying out a linking of operands A, B, C of the A×B+C type within the cell. This operation is of particular significance in the field of digital signal processing, and the bus structure is therefore especially suitable for logic cell arrays for the construction of real-time configurable DSP arrays.

According to another example embodiment, a logic cell array can perform arithmetically multiplicative linking of operands if at least two of the line bundles for data for the bit width being processed are led out from the cells, in particular with one line bundle for high-order bits and one line bundle for low-order bits. In this way, for a data word width of 32 bits, a 64-bit-wide output is created in order to output the result of a multiplication in full width.

In reconfigurable logic cells, control inputs may be addressable in particular via the segmentable bus system and are disposed in such a manner that at least the logic cell's sequence control signals, such as the signals Reset, Step, Stop, Go and Reload, are transferable into the cell. These trigger and/or enable a reset, a reconfiguration and an activation, respectively. For this purpose a corresponding number of bit lines may be provided. In one embodiment, at least two bit-wide data lines are therefore provided for control signal inputs. Each of the control signals may have a separate signal input assigned to it. Alternatively, an input linking circuit on a several-bit-wide status line may provide for an orderly addressing of the cell. These signal inputs are control signal inputs that can carry the signals that control configuration and/or reconfiguration (flow control signals), such as trigger signals. The actual communication of the cell with the unit or a reconfiguring unit, such as a configuration manager (CT or CM) may thus be achieved by techniques, for example, via the so-called ready/ack/rej protocol, which permits a reconfiguration of the cell only under certain conditions. For the details of this protocol, reference is made to the above-listed patents and additional publicly accessible documents about XPP/VPU architecture.

In the case of rebooting. The bus structure may be designed for this accordingly.

Furthermore, the bus system may be routed to I/O interfaces and/or to external data memories. In other words, the segmentation structure may be used to advantage both inside and outside the logic cell field. I/O interfaces transmit from bus systems that are inside chips to the outside. In this context any bus systems, in some cases alternating in time, are connected for external output and/or input. In addition, the possibility may exist of combining several bus systems in such a manner that they are synchronized with each other. For example, any two output bus systems or an input bus and an output bus together may be synchronized.

In an example embodiment of the bus system, a series of interline elements is provided. Here "line" indicates in particular a first-class conductor, such as a continuous metal line within a semiconductor wafer. "Interline elements" indicate those elements that are disposed between any two lines that are assigned to each other. Interline elements may be connecting switches, in particular the control arrangements that respond to the requirements of logic cells and/or the communication thereof and/or other units; thus, the switch may, for example, open or close at the request of a configuration manager, that is, a unit that configures the logic cell field. This makes it possible to use a compiler to establish how the bus structure is to be designed. In particular the compiler or another configuring or controlling unit is able to determine whether the communication between two cells that are separated is to be accomplished via segment lines having shorter or longer segments, and moreover, if there are a number of longer segments, a preference may also be specified through which one of a multiplicity of segment lines the communication is to occur. In this way, the power loss through the switch may be minimized and/or an optimal adaptation of the data conversion and/or processing to signal propagation times may be provided along the bus lines.

The interline elements may additionally or alternatively include multiplexers in order to feed a signal from a line to one of a series of destinations, such as logic cells, and/or lines that continue further and feed the signal to a multiplicity of destinations, in particular selectable destinations, simultaneously.

Furthermore, registers may be provided as interline elements.

These perform different tasks. In this manner data may at first be kept on the bus until a destination is ready to retrieve them. Furthermore, when busses are very long, data processing can be prevented from being properly completed if the long periods of time until the data arrive at the destination when paths are long and (in some cases) the return of the reception confirmation is taken into account. Buffering the data in registers increases the total amount of time (delay) until a data packet traverses the bus, but the interim time until arrival of the data (latency) in which the array or individual cells may not be used meaningfully is reduced. A tradeoff between latency and delay may be required, in which the register is switched in, for example, only under predetermined and/or established conditions, such as very long bus paths. It may then be advantageous if the switching on of the register is controlled, e.g., by a control unit or similar item, like a configuration manager, which in turn is able to operate in response to compiler-generated commands. Furthermore, it may be advantageous to provide a register in order to ensure a synchronous arrival of bits of different significance at a destination point. If busses are fed back, that is, a connection is provided from a cell output to the input of the same cell, registers may be used in such high-frequency feedback loops, to prevent damage to components by the register-imposed delay time.

In a particular implementation, registers may be designed all or in part as additive and/or multiplicative registers; specific links may be implemented without problem and with little circuitry effort, and, thus, the logic cell structure may be relieved on a net basis via shifting of simple linking tasks. In particular, a register may be designed precisely for the purpose of linking two operands algebraically; in busses for transmitting status signals that indicate the status of a logic cell or a series of logic cells and/or trigger a change thereof, that is, in busses for so-called trigger vectors, the registers may preferably be designed to implement Boolean links and/or lookup tables, such as modifiable lookup tables.

Line drivers can also be provided as interline elements.

This may be necessary in particular for multiplex systems that provide a very strong signal fanout.

In an another example embodiment of the present invention, it is possible to provide a change from one segment line having longer segments to a segment line having shorter segments and/or vice-versa along a data transmission path. This permits the provision of roughly equal signal propagation times for the communication of a larger number of cells in the same direction, that is, along the same bus structure, via an appropriate combination of short and long segments, even if buffer registers are provided. The bus structure in this context is comparable to a street that has fast lanes and crawler lanes and enables a lane change at predetermined intermediate positions.

In yet another example embodiment, the bus system may include a multiplicity of parallel segment lines in which several parallel segment lines are provided with longer segments. The longer segments of the segment lines that have longer segments do not all need to be of the same length; a staggered arrangement may be provided.

When there is a greater number of parallel segment lines, the segment line ends and/or interline elements may be disposed within the segment lines at an offset in relation to each other in the bus direction. Typically, interline elements, such as, switches, registers, multiplexers and drivers are provided at the segment line ends or leads. The hardware technology implementation of these elements then requires substantial space, which may be considerable compared to that of the lines to be disposed in the intermediate layers. The offset disposition of these elements then ensures that space has to be provided only for interline element arrays of, for example, two or three segment lines, but not for interline element dispositions of all available segment lines. Also it is possible not to provide drivers or registers for all interline element dispositions, but only to provide them every nth segment end. However, in this case, it is advantageous that at least three segment lines that have longer segments for at least two segment lines have segment line switching circuits, in particular multiplexers provided at predetermined positions as interline elements. In this way, the desired segment change may be configured as required. Segment changes occur at crossings and are possible among segment pairs or segment groups that vary along the bus. It is then possible that the segment line switching circuits for the change from a first to a second segment line are provided at a first position and the segment line switching circuits for the switch from a second to a third segment line at a second position.

In addition to switching by pairs, it is also possible to select, at a position or a multiplicity of positions, among several segment lines to switch to and/or to which data are simultaneously output.

In an additional aspect of the present invention, two-way communication of the cells is possible for the logic cell array. In bus systems having interline elements, such as drivers and/or registers, directions of travel are defined. In order to enable the communication of the cells in two directions, separate bus systems are provided for opposite running directions. At least in one direction, it is once again possible to provide at least two different segment lines with shorter and longer segments, in particular ones that are once again generally parallel.

If the segment lines are separate for the two directions of travel, a register may be provided for at least one direction of travel. As explained above, the register may be provided in the bus system that is routed in the reverse direction, i.e., to that bus system, with which signals may be routed back from an element output to an element input.

According to another aspect of the present invention, a first bus system may be provided for the transmission of data to be processed and a second bus system may be provided for the transmission of status and/or monitoring or control information. One or both bus systems may be formed with segment lines having short and long segments, and the respective bus systems or bus arrays may be configurable separately from each other, or definable in their circuitry and/or regarding the operations in linking registers or the output of lookup tables.

The bus system may be used in a logic cell array in which a plurality of logic cells are arranged adjacent to each other in a row. The longer segments then bypass at least one logic cell. If the logic cell array includes even more logic cells in a row, the longest segments may bypass more than one logic cell.

It should be pointed out that, in at least two-dimensional logic fields having a disposition of logic cells in rows and columns, a segmented bus system may be provided in each row and each column and have the previously described structure having long and short segments in parallel segment lines.

The described bus structure may be advantageous in arrays in which data processing units, such as logic units, are to be linked to each other. However, special advantages are offered if the logic cells are selected from, include and/or form arithmetic-logic units, DPGA's, Kress arrays, systolic processors and RAW machines, digital signal processors (DSP's) that have more than one arithmetic-logic unit, configurable (programmable) logic cells or other cores and/or PAE's, ALU, input/output (I/O) functions and/or memory management units (I/O) and memories. A successful implementation of a bus structure having segment lines that have short and long segments is the VPU/XPP processor unit produced by the applicant.

Such a processor may have a multiplicity of different communicating logic units disposed in an array, the logic units having at least memory storage and data conversion units and the memory units being disposed close to the edge of the array. This makes it possible to have data run through the array and be buffered, if necessary, at the edge in order to bring about reconfiguration as required. The flow may also occur via parallel rows or columns and/or in a meandering way, in order to thereby provide increased computing power.

Additionally, input/output units may be disposed closer to the edge than the storage units. This allows the buffering of data before processing by passing through the array. However, in any case communication of the logic units, at least from edge to edge, for at least one bus system to be provided that is, in particular, segmentable as previously described. Then, data read from a first memory that is close to the edge may be changed as required in a first data conversion unit that is close to this edge, and transferred from there into at least one other data conversion unit in order to carry out further data modifications as required. The data, after flowing through a plurality of data conversion units into a second memory close to the edge may be stored at a position distant from the first memory, and then a reconfiguration of the data conversion units may be carried out for the re-determination of the data conversion, and the data may be routed through at least one part of the data conversion units, possibly in the opposite direction of travel. It may also be provided that the outgoing run is made in a row and the return run in that row or a row situated beneath it in order to take into consideration pipeline effects.

The processor may have at least one programmable gate array (PGA) and several data modification units having ALU's. At least one PGA may be surrounded by other data conversion units, in particular ALU's, in order to be able to obtain data easily for linking purposes and/or output them.

It is possible that, in an array made up of reconfigurable units, several (sub-) arrays, particularly identical ones, are provided that may be brought into communication with each other. For this purpose, each may include a reconfiguration unit that may be designed for reconfiguration of the reconfigurable element of the array. Running inside the array are the bus structures appropriately described above. A configuration manager, which may in particular be disposed on an array side on which no memory units and/or I/O units are provided is thus assigned to each array, the reconfiguration unit may extend over the breadth of the array, which offers the advantage that an optimal chip form may be produced.

A supervising configuration manager which is common to the arrays and which extends in particular over the breadth of more than one array and which is designed for communication with at least several or all of the supervising configuration managers, may also be provided.

Alternatively or additionally, given such a processor having arrays that may be brought into communication with each other, in particular identical ones that have reconfigurable data conversion units, it is possible for the arrays to have switching units (VPAE's) between them that are disposed among the fields for communication switching.

Using such switching units (VPAE's), data and/or control signals (monitoring signals, trigger vectors, etc.) may be transmitted.

The configuration units of at least two of the arrays may be in direct connection with each other. As a result, a supervising configuration unit may be omitted and/or a fault tolerance may be increased. For this purpose, the communication of the configuration units of the at least two arrays that are in direct connection with each other is determined via dedicated fixed lines and/or data lines that are pre-configured, that is, established during bootup.

The switching units (VPAE's) may include two configuration registers, the first configuration register being addressable by the first array and the second configuration register being addressable by the second array. Only if access to the switching units has been permitted for both arrays, is data transmitted accordingly. For this purpose, the first array may permit the insertion of data in the switching unit by appropriate configuration of the first configuration register and signal the insertion of the data to the other configuration units via the dedicated line. Afterwards, the data is retrievable, which is ascertainable by configuration of the second configuration register. A sluice-like transmission of data is enabled by the VPAE's. The separation of a larger array into sub-arrays in other respects generally allows the reduction of the configuration effort to be handled by a configuration unit and as a result may contribute to an efficient array operation that is not impaired by a bottleneck imposed by a configuration unit.

The sub-arrays may be brought into communication with each other via multiple data conversion and/or transfer units (VPAE's) so that no data rate limitation is produced in the data processing.

The geometric hardware may be configured such that the communication-enabling data conversion units are connectable on both sides via busses running along the array, the busses being designed in particular to run past the array edge and there in particular may be routed further to I/O interface units.

As explained above, the processor may include one or more data relaying rule implementation arrangements, in particular a lookup table that are designed to enable relaying of data and in particular data conversion in response to the joint fulfillment of a multiplicity of criteria, in particular event-related criteria. The data to be relayed may in particular be data or trigger vectors that are involved in the reconfiguration and/or reconfigurability of logic cells. The function or the conversion of the relevant data relaying rule implementation arrangement is configured accordingly.

The processor may also be configured using segmented bus structures so that data conversion units and data storage means are provided, at least a few of the data conversion units being locally assigned data storage arrangement and in particular, an arrangement being provided to locally read out data that is locally written into the local data storage arrangement for the further local recent data modification. In other words, interim results may be stored in a logic cell and be further processed along with other data and/or using other links.

If there is a reconfiguration of a cell array made up of logic cells that are reconfigurable while in operation, which allows in particular a reconfiguration in response to the propagation of specific pre-determined data, then one may select whether the reconfiguration occurs in response to the data propagation for all logic cells into which the data that was pre-specified and/or derived therefrom flow and/or only for a part, in particular a processing branch (e.g., an if/then branch), while at least one other branch remains unchanged, which reduces the reconfiguration effort and/or only a sub-chain of a longer row of logic cells, in particular, sequential data-processing ones, is reconfigured, such as up to a predetermined logic cell, and/or in order to permit the reconfiguration immediately or after that data processing or further data processing. This substantially increases the practical use of the wave reconfiguration. It should be mentioned that such a selective wave reconfiguration is possible using only a few commands, in particular, for example, the commands Reset, Step, Stop, Go and Reload. Consequently, the number of trigger inputs or control inputs that are routed to a reconfigurable logic cell, such as a PAE, is small.

The manner in which a logic cell reacts to a specific characteristic data packet in wave reconfiguration is capable of being pre-loadable. This may happen in particular by pre-loading the lookup tables that are provided in the busses. The busses in this context may in part be routed via logic cells and/or formed by and/or with them.

It is possible without any other measures to use the processor array having the bus system of the present invention in order to approximate the behavior of non-linear systems quickly and simply in calculations. This may happen by approximations being determined for one row of working ranges that are adjacent to each other at one temporary working range (n) and at the working ranges that border it below and above ((n−1), (n+1)), the parameters that enable the approximations are pre-loaded, the behavior with the central (n) working range is approximated until that working range is exceeded inside of which the approximation is suitable, then that approximation (n−1) is used for further work which belongs to the working range into which the exceeding proceeded, and the approximation at that working range (n+1) into which the exceeding did not proceed is overwritten using an approximation (n−2) that, together with the previously used approximation (n), encompasses the currently used approximation (n−1) or the accompanying working range. By overwriting that working range in which the operation value is not run, only three variants need to be pre-loaded in order to ensure a rapid further processing after the range is exceeded. Because the overwriting of the preloaded working range happens during the data processing, a constant data computation is possible during a steady transition of the operation values without greater leaps or abrupt changes. It is possible that this manner of approximation may not transferred to multidimensional cases due to operation value encompassing in more than one direction and corresponding overwriting of the intervals that no longer adjoin the current operation value interval after the overwriting of an n-dimensional operation value interval.

DETAILED DESCRIPTION

Figure 1:
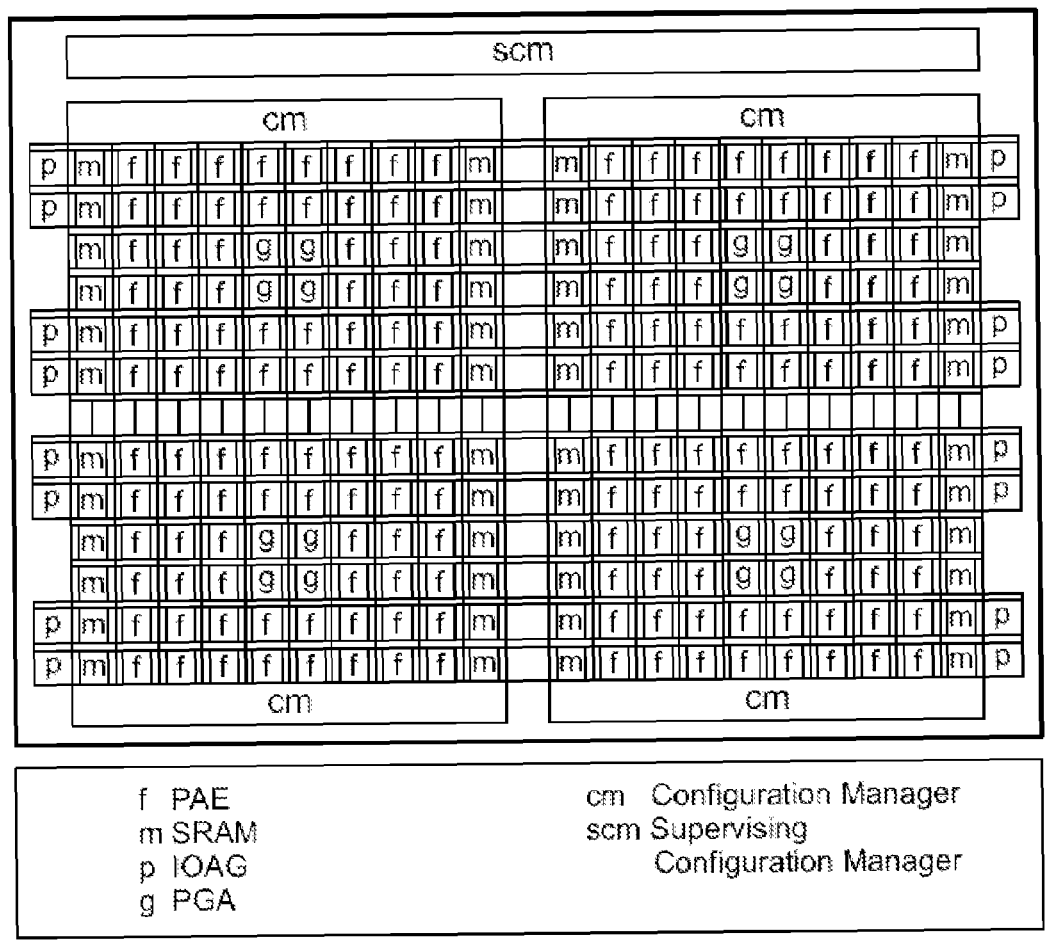
FIG. 1 shows a logic cell array configured in accordance with an example embodiment of the present invention.
Figure 2:
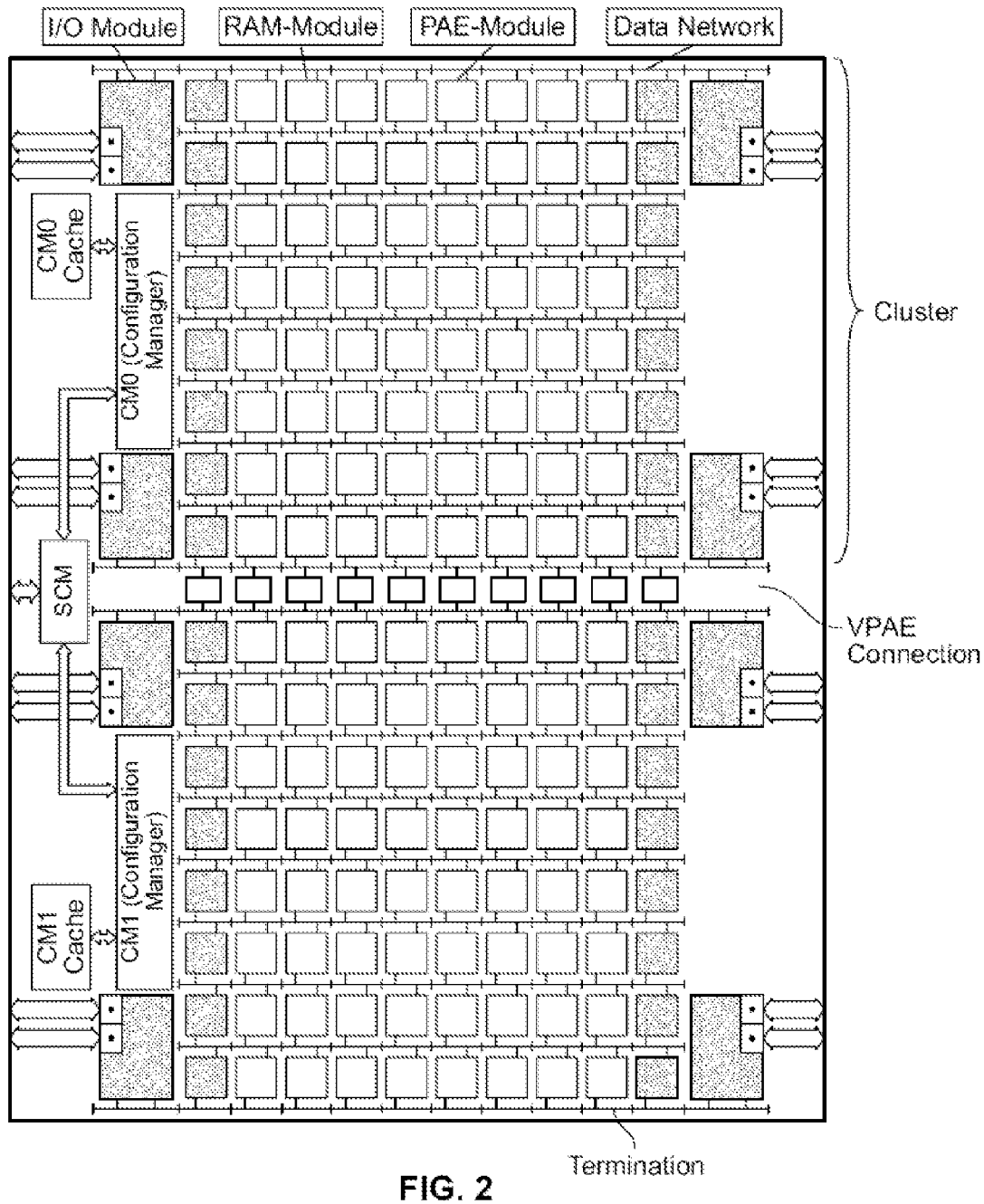
FIG. 2 shows a detailed view of the logic cell array having clusters.
Figure 3:
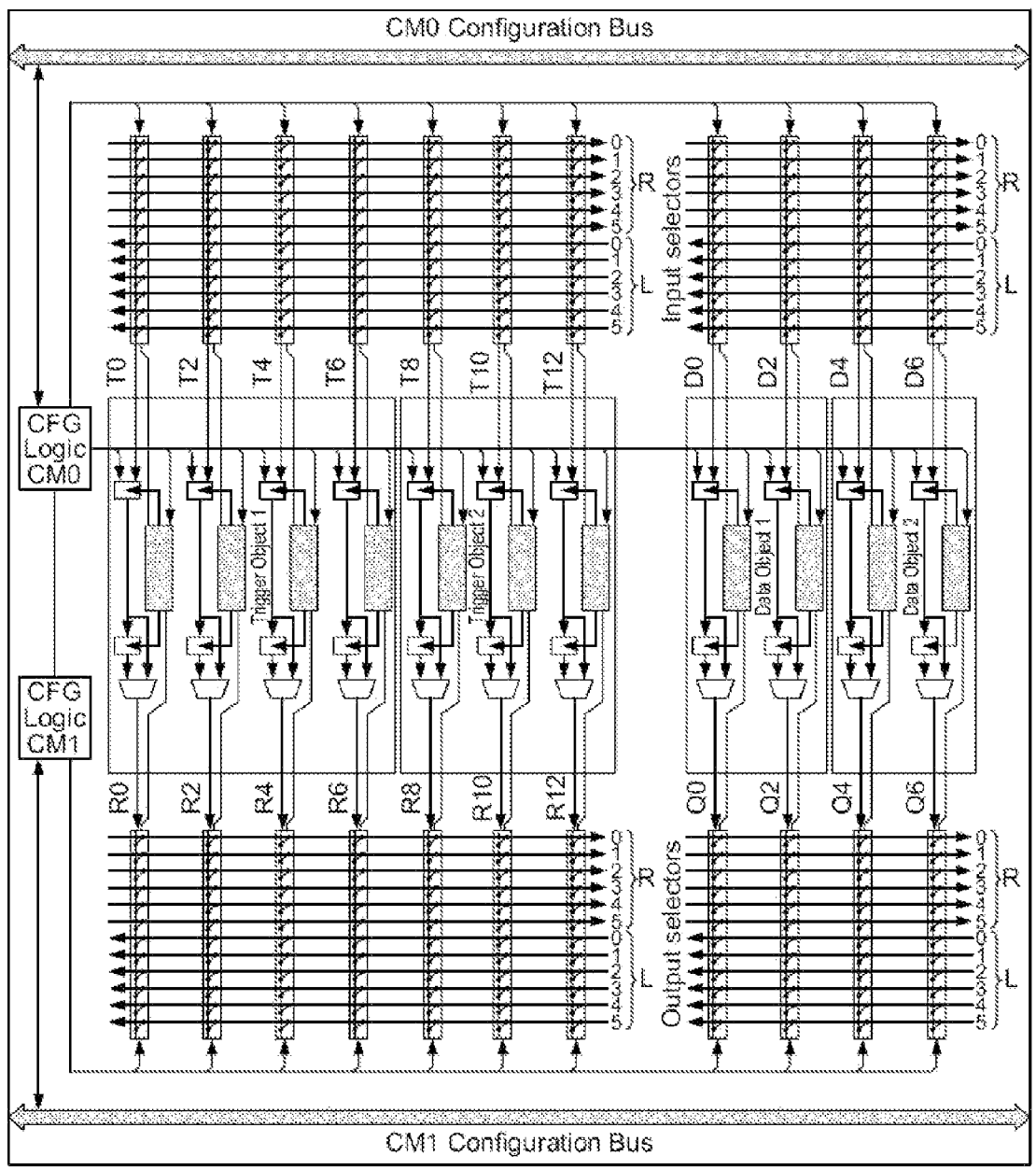
FIG. 3 shows an example for a forward register of a configuration bus according to the present invention.
Figure 4:
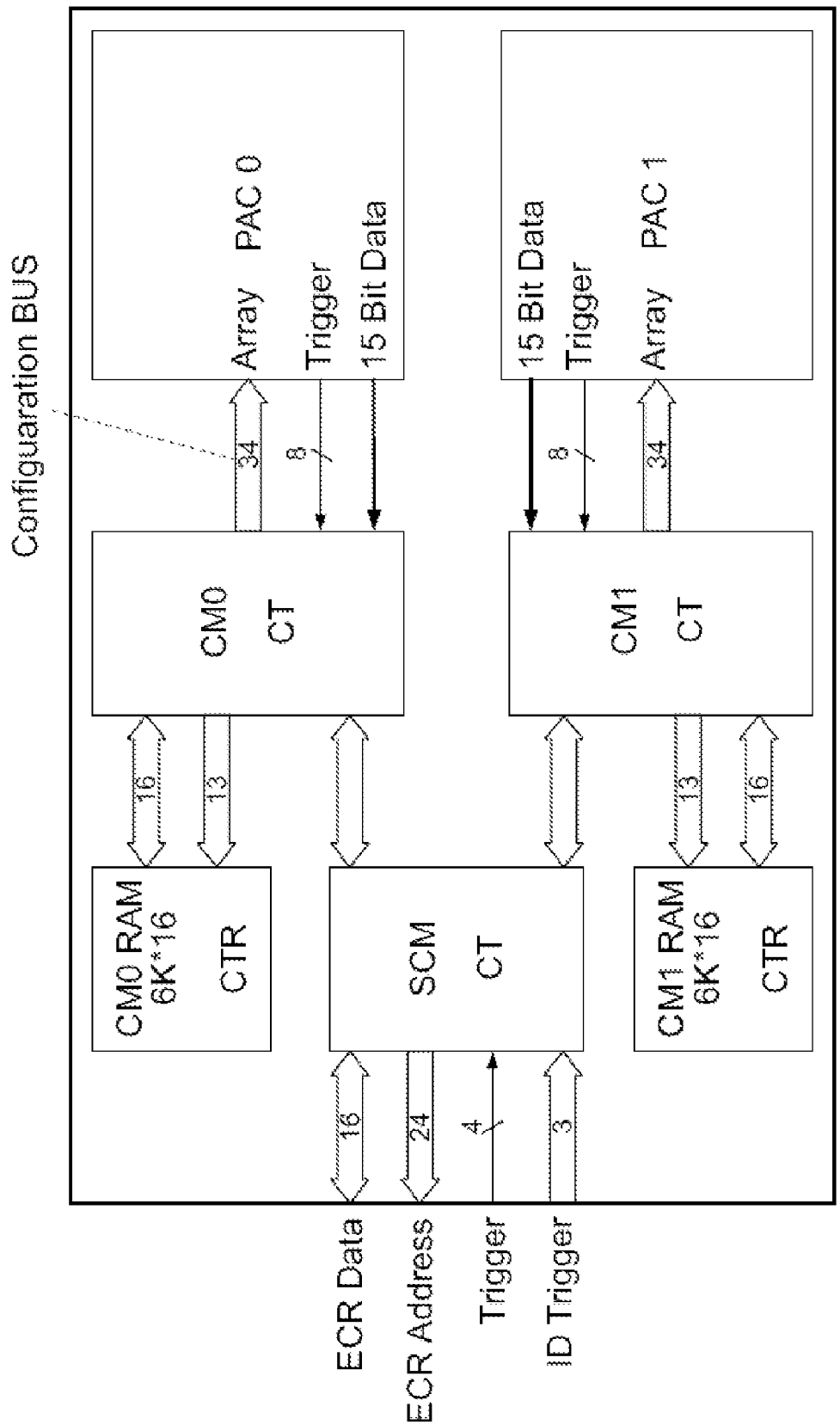
FIG. 4 shows an example embodiment of the hierarchy of configuration managers of a logic cell array according to the present invention.

According to FIG. 1, a processor 1, which may form a unit that may be characterized as an XPP (extreme processing platform), includes two fields or clusters including: a number of arithmetic logic cells (ALU-PAE's=arithmetic logic unit processing array element); memory cells (RAM-PAE's=Random Access Memory processing array element); several illustrated as four input/output cells (I/O elements, input/output processing array element); a bus system running through each field; and a configuration manager that is assigned to the field, these elements together as a cluster forming a unit, which by itself is capable of processing data and doing so as a reconfigurable unit and a higher-order configuration manager being assigned to the two configuration managers (CM) of the cluster in order to form thereby a master cluster or the XPP. It is possible using tree-like hierarchical structures to have more than two fields of processor elements cooperate. In this manner, a higher-order configuration may be placed over more than two configuration managers (CM), which on their part are each assigned to only one individual PAE cluster and/or it may be provided that a multistage configuration manager hierarchy is built up, in which a configuration manager central level is actually assigned to first configuration managers (CM) and in turn is placed under one or more hierarchical levels.

FIG. 1 thus depicts the arrangement of the cells to each other in a two-dimensional matrix and its relative size by way of approximation insofar as the individual cells are disposed very regularly and in particular the PAE's, that is, the memory storage and arithmetic logic cells have approximately the same size, which makes it possible to carry out a page addressing in the generally rectangular and/or regular cell structure having a roughly equal linking to the bus system. The depicted addressing in this context, however, is arbitrary regarding the disposition of memories and arithmetic units in relation to each other, insofar as other dispositions, also involving the I/O cells and/or using still other elements, are possible and are adaptable to a desired special computing task without any further measures. The illustration that is shown is also exemplary in that a three-dimensional disposition of individual cells within the space is also possible, provided that the manufacturing technology of the semiconductor technology that is used permits this.

An individual PAE includes a multiplicity of inputs and outputs. The individual PAE is provided, on the one hand, with data inputs and outputs (A,B,C) and, on the other hand, with control or monitoring inputs and outputs (U,V,W). As is evident from FIG. 1, the PAE's are disposed in horizontal rows, the cells being connected among themselves via a bus system. These horizontal bus systems are connected in the center of the field to the PAE's that are situated above and below them, and to be precise with them only above and below in the depicted example. Thus, the transfer of data and status signals (i.e., control signals) upward and downward is accomplished via the PAE's and, as illustrated in FIG. 1, involves a RAM-PAE or an ALU-PAE. Consequently, all types of PAE's may be connected in the same manner to the bus system and internally wired accordingly. It is also possible to configure the I/O cells for connection to bus lines that are situated one on top of the other, unlike what is depicted).

As a result, the PAE's are used for the relaying of data, that is, for data to be processed as well as control and monitoring data in the vertical direction. The PAE's in this context are configured in such a manner that this relaying may be carried out with or without data modification.

Figure 5:
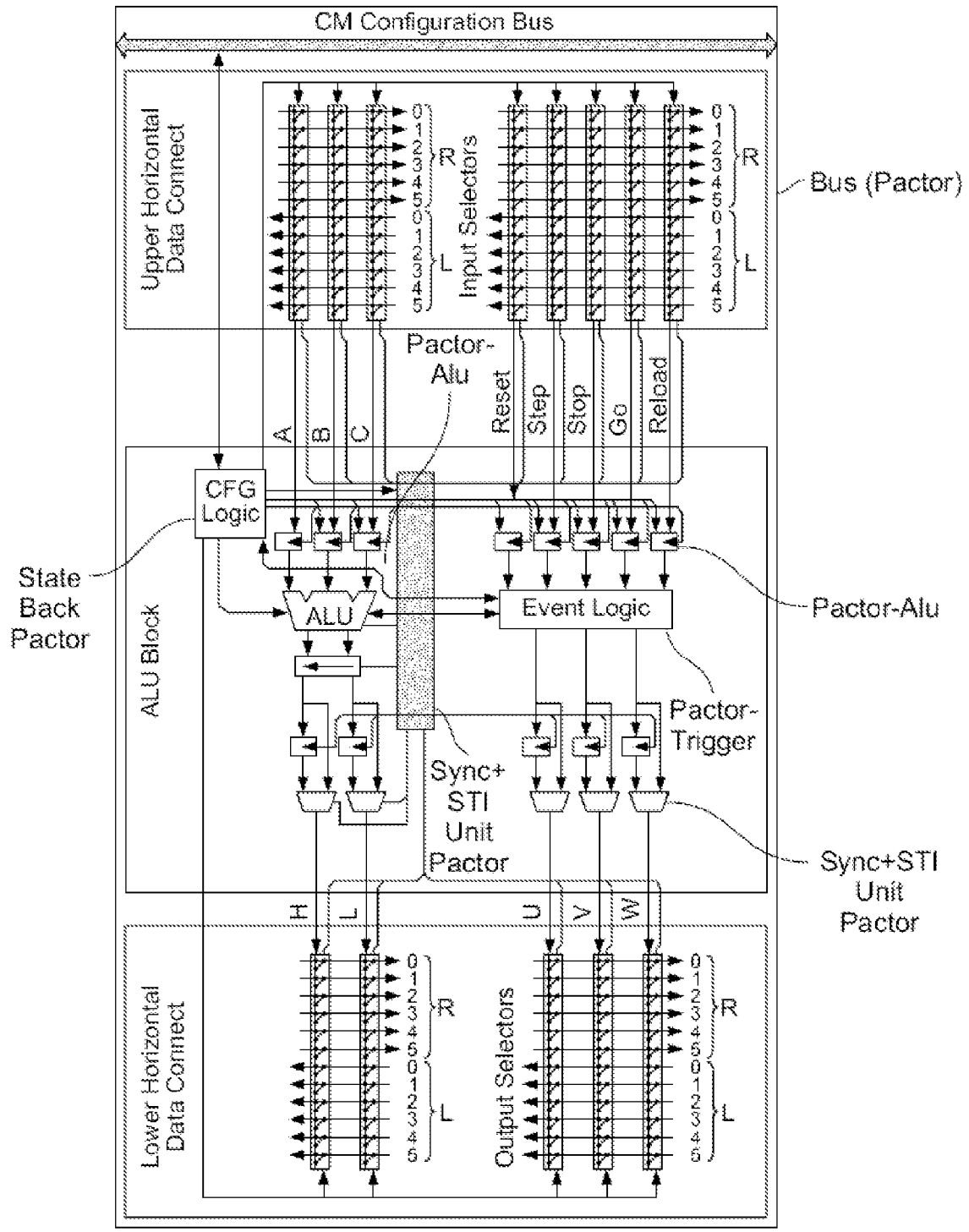
FIG. 5 shows details of a PAE including data according to an example embodiment of the present invention. The three data inputs A B C in the logic cell, the five trigger inputs for the trigger vectors Reset, Stop, Step, GO and Reload, the two data outputs H(igh) and L(ow) as well as the status signal outputs UVW and the bus coupling are depicted.
Figure 6A:
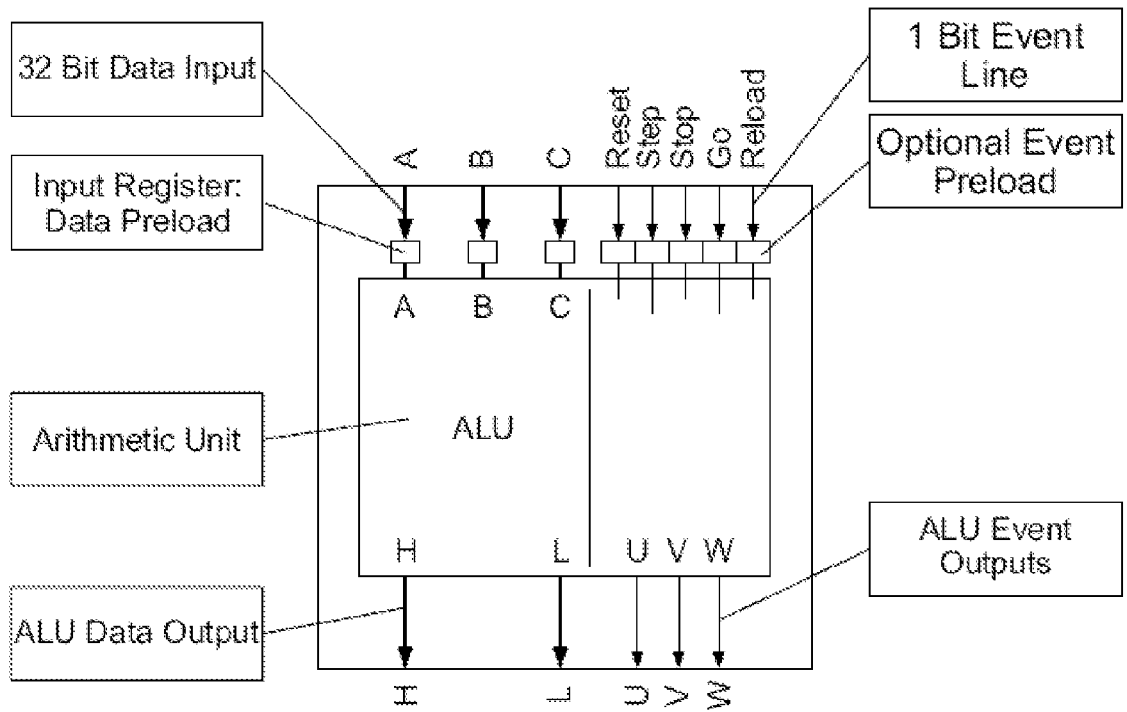
FIG. 6a shows the structure of the logic cell in the block diagram according to an example embodiment of the present invention.
Figure 6B:
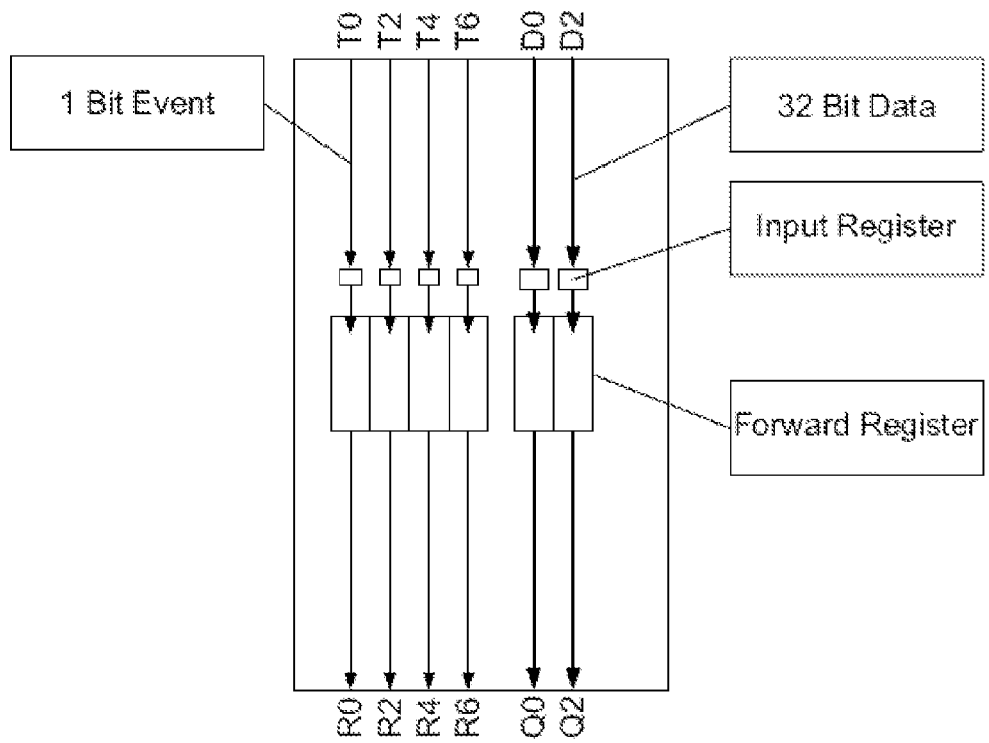
FIG. 6b shows the structure of a register according to an example embodiment of the present invention.
Figure 6C:
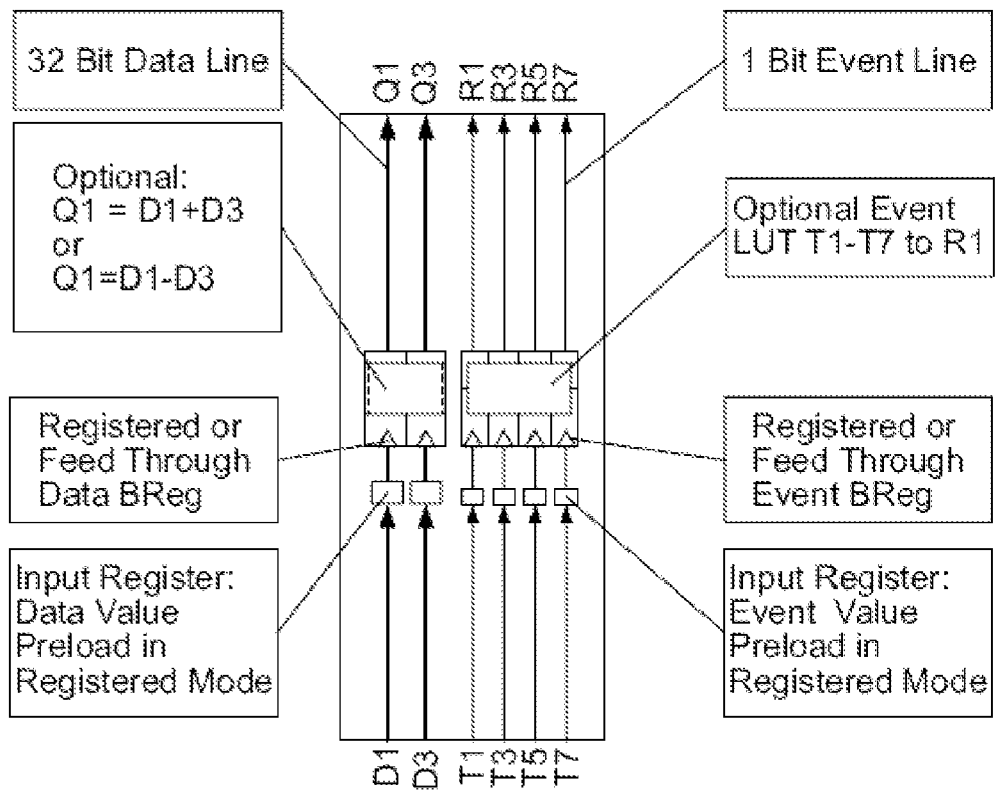
FIG. 6c shows the structure of a reverse register for event signals having the optional lookup tables according to an example embodiment of the present invention.
Figure 6D:
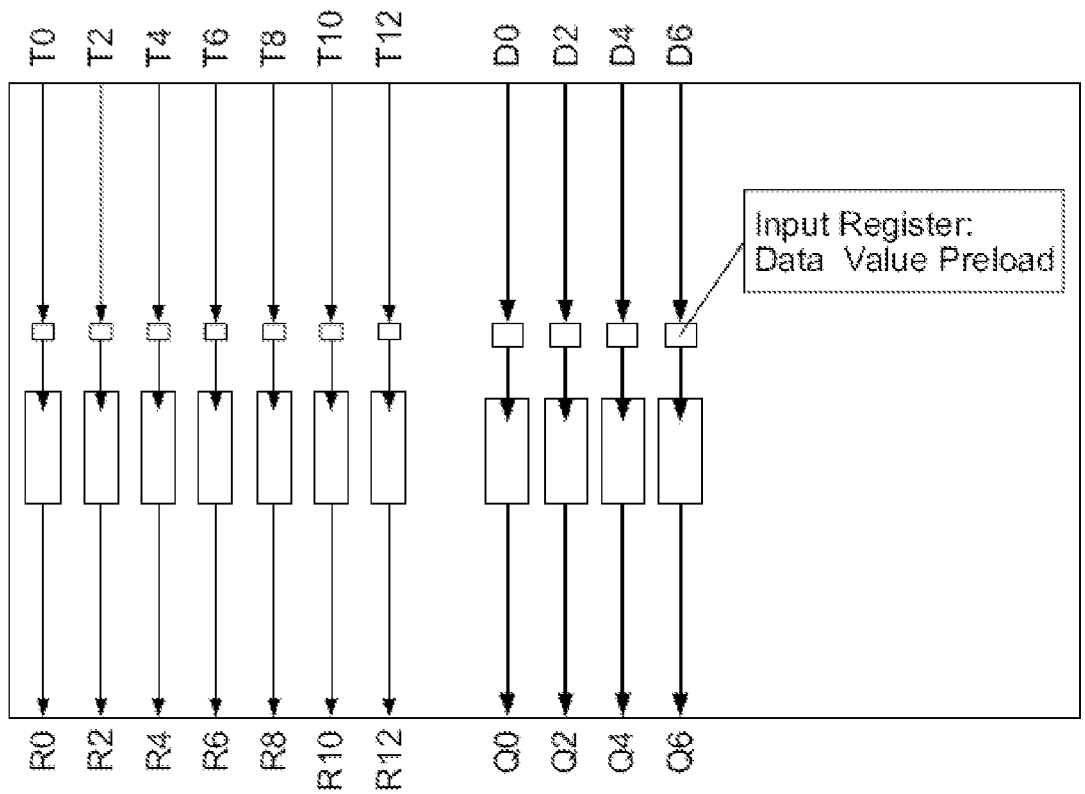
FIG. 6d shows a forward register having pre-loading capability according to an example embodiment of the present invention.
Figure 7:
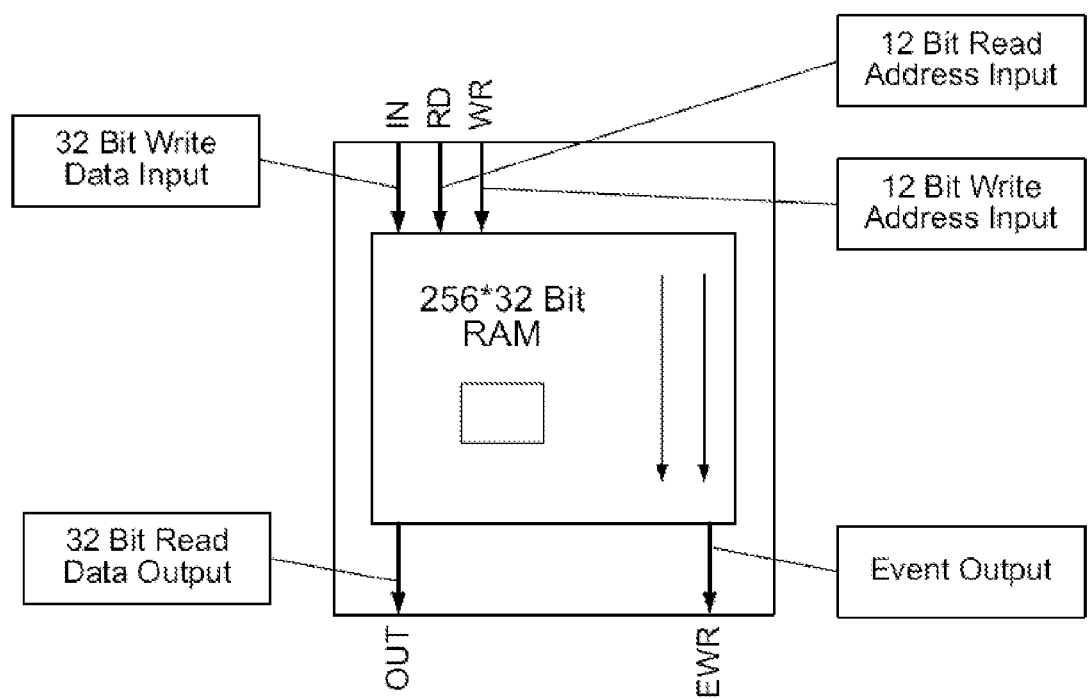
FIG. 7 shows a structure of a memory cell that has an input that is distinguishable from data conversion logic cells and has a correspondingly different required bus width according to an example embodiment of the present invention.
Figure 8:
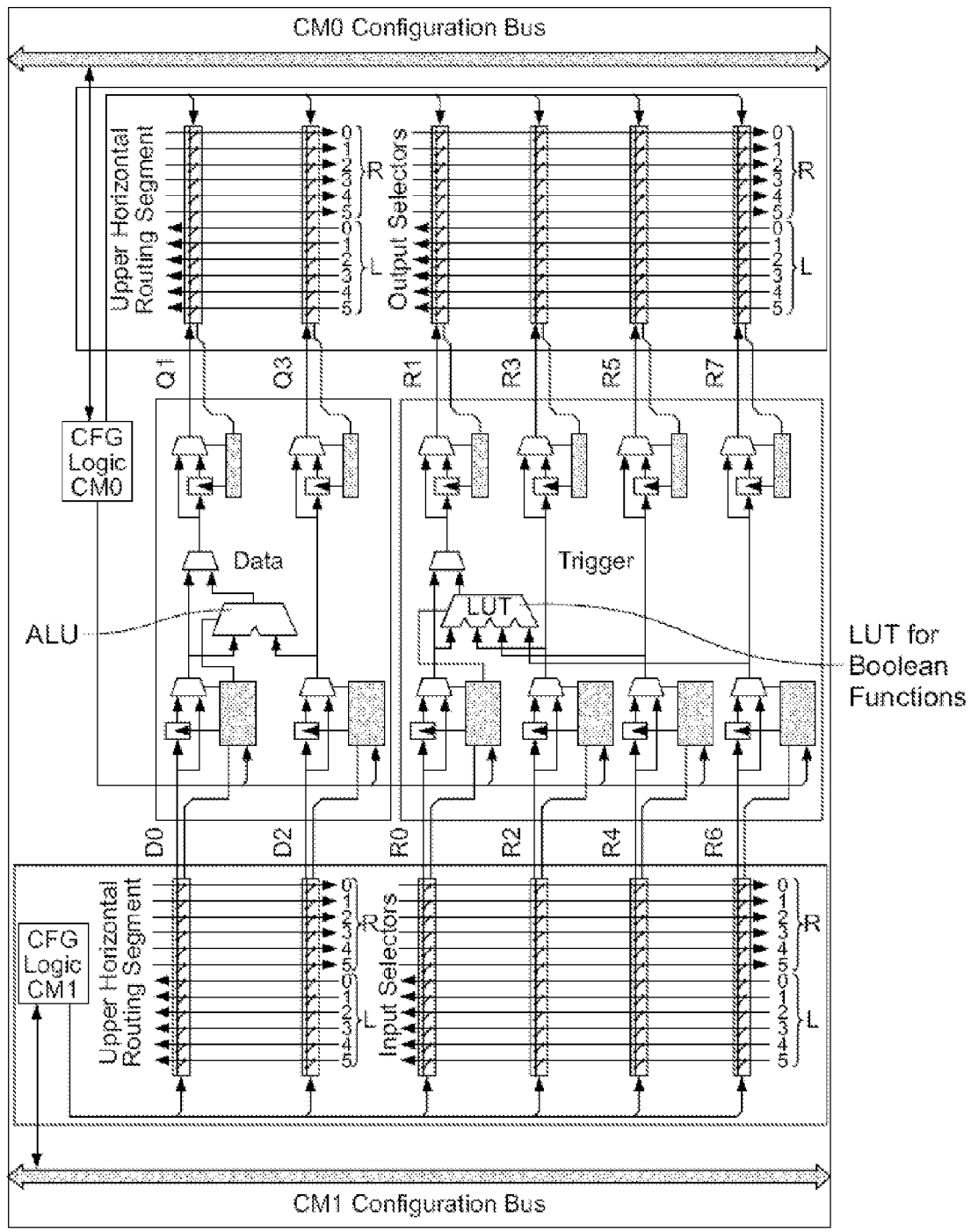
FIG. 8 shows another detailed view of a reverse register in the configuration bus having a lookup table for the implementation of Boolean links from trigger vector bits according to an example embodiment of the present invention.
Figure 9:
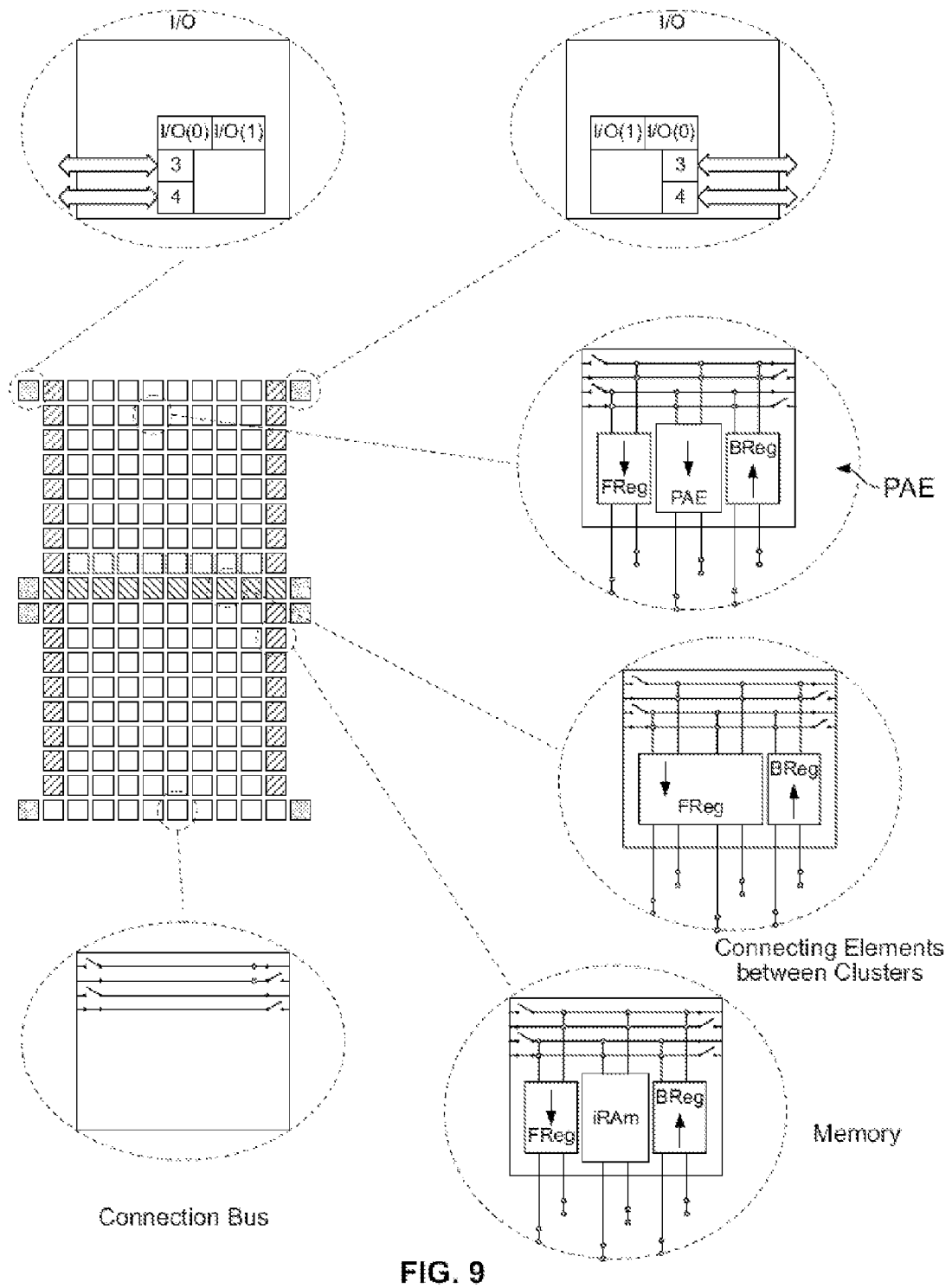
FIG. 9 shows additional processor details, in particular of the busses according to an example embodiment of the present invention.

The data modification may at first be accomplished in the actual functional unit of the PAE, e.g., if it is equipped as an arithmetic-logic unit and the data are linked in the arithmetic logic unit. In order to ensure that data may be supplied sufficiently rapidly to be linked in the cell and bring about an optimal utilization of the cell cycling, three lines A,B,C having the bit width that is able to be processed in the cell are routed to the cell as shown in FIG. 5. In this context, a particular additive input length is also possible that allows determining operations of the type (A+B)+C in a time-efficient and space-efficient manner using the cell results. If no data conversion is required, the data may be passed on to the functional unit. In this way, for example, data that are needed in a row further below are passed through into it without being subjected to a modification in the PAE. In the simultaneous routing of, for example, three data words corresponding to three inputs A, B, C, each may be relayed in different ways. Therefore, it is possible, for example, to relay only the data word to line C unconverted, while A and B are linked to each other in the ALU, for example, by A/B division. Alternatively, two data words may also be rerouted, while a data word in the ALU, for example, is linked to a constant or another value temporarily stored there. The convertibility to other data word amounts that are simultaneously routed to the PAE may also if desired be routed to the PAE as three data words; the individual word in this context has the processor-specific bit width, in the present case, for example, 32 bits.

Any inputs and/or outputs of PAE's may be configured using constants of the configuration unit (CT/CM). In this context, constants may remain unchanged during the entire operation of a configuration, or be overwritten during the operation, that is the execution of a configuration of new data of the configuration unit (CT/CM) and/or other sources, such as PAE's.

Instead of a linking of all or a part of the data as in the case involving PAE's having ALU's specifically in the RAM-PAE's, a complete or partial memorization and/or a complete or partial relaying may occur.

The relaying of the data, furthermore, may occur while bypassing the actual data conversion PAE core unit, like the ALU, in such a manner that a conversion of the data occurs before or during the relaying. This may occur by modifying the data while consulting the lookup tables and other linking units, for example, units that sort the relevant data words according to value. These units may be disposed between the bus coupling and the input into the PAE core unit and configurable in their function, whereupon whether the data are relayed unchanged or not is configurable. If they are not relayed unchanged, but rather changed, how the change occurs within the given possibilities is configured. For the status signal relaying in this context the provision of lookup tables is advantageous, because predetermined output signals may be generated with them in response to predetermined input signals without any additional measures.

Furthermore, the data relaying of unchanged data may be accomplished in a configurable manner immediately or delayed by register. The illustrated individual PAE for this purpose has a configurable, connectable forward register and a configurable, connectable reverse register for the data to be processed and a configurable, connectable forward register and a configurable, connectable reverse register for control data, that is, trigger vectors or status signal and/or control flow data. It is indicated that registers having increased (temporary memory) depth, in particular as FIFO registers, would be foreseeable, precisely in order to temporarily store data on a multi-cycle basis. Assigned to the register in question is a configurable multiplexer with which the register in question may be connected into the data path or removed from it, as desired. The multiplexers are also configurable such that results from the cell may be connected on the bus as desired and required. Therefore, for example, the top and bottom bit word that is obtained in a multiplication are output (H,L) and/or only a result data word (H) is output and a data word relayed and output on the bus, even a desired exchange (A<->H) being configurable. Consequently, a PAE is characterized in the present processor model by a structure that has a central functionality lie an ALU, a RAM and/or, for example, also an FPGA and the additional data relaying functionality, possessing a forward and/or reverse register data relaying functionality comprised of three basic modules, such as FPGA, ALU, RAM and the two (forward/reverse) register data relaying functionality modules, the latter of these being able to implement additional functions. Central functionality in this context does not mean spatial central functionality, but rather functionality in the sense of assigning the central functionality and effect of the particular PAE. The additional functions, which are implemented via the register data relaying functionality modules, include in particular, in the forward register for the data flow, control operations like multiplexing or demultiplexing and copying and/or other manipulations of data. In the reverse register, an ALU functionality may be implemented for the data flow and/or a Boolean linking of event signals, i.e., trigger signals. Thus, the PAE is comprised of modules for the manipulation of data streams, for the operative linking and/or generation of data packets and the processing for the most part via logic linking and generation of event packets.

Figure 10:
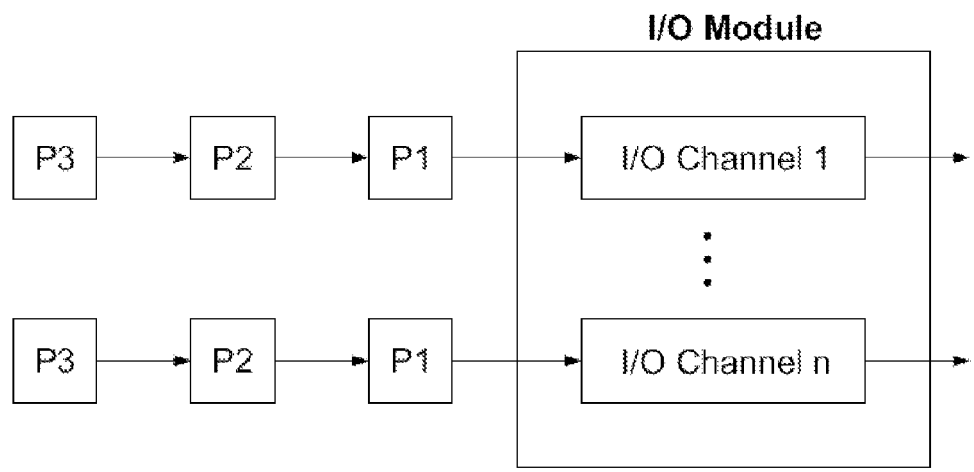
FIG. 10 shows an unsynchronized I/O circuit having two busses according to an example embodiment of the present invention.
Figure 11:
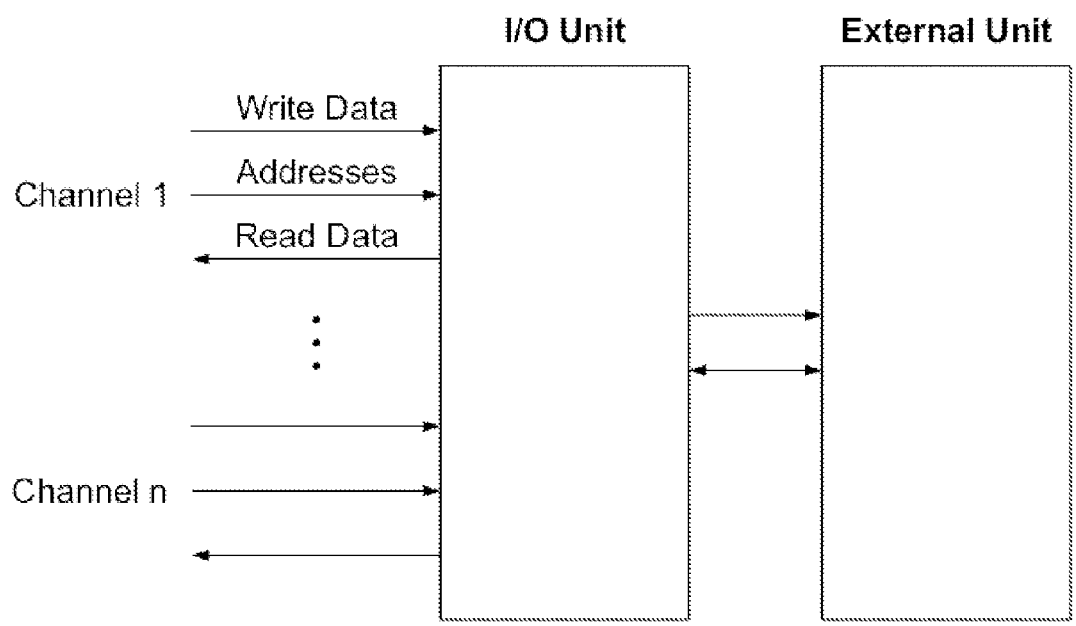
FIG. 11 shows a synchronized I/O circuit having two busses according to an example embodiment of the present invention.

The input/output modules are likewise adapted in their structure in a particular way to the requirements of the data processing task. For this purpose, each of the input/output modules is provided with several channels, that are able to work independently of each other in the so-called PORT mode (FIG. 10) or in synchronization with each other in the so-called RAM mode (FIG. 11). Each I/O module may be used simultaneously by a plurality of algorithms while using a plurality of algorithms, for which sorting algorithms may also be brought in.

In other words, the input/output module (I/O interface) works in memory (RAM) mode (FIG. 11) as an interface to the external memory. In this context, writing data and address data of any channel are synchronized, that is, an external writing operation is started only if both data packets are present. In reading mode, the I/O unit sorts from externally transmitted packets back to the internal channels. The switching between reading and writing mode may occur, for example, via configuration or, for example, via signals.

What is claimed is:

1. A reconfigurable chip, comprising:
    a plurality of data modification units that are interconnected at least two-dimensionally and runtime reconfigurable in function and interconnection, wherein at least some of the data modification units are arithmetic logic cells that each:
        has three inputs A, B, and C adapted for feeding to the respective arithmetic logic cell respective ones of three data words A, B, and C on respective ones of the three inputs A, B, and C; and
        is adapted for performing within the respective arithmetic logic cell an operation of the data word A× the data word B+ the data word C;
    registers adapted for receiving output data of one of the plurality of modification units and feeding the output data back for further processing in the modification unit;
    registers adapted for delaying arrival of data at respective ones of the plurality of modification units to synchronize the arrival of the data with an arrival of other data at the respective modification units; and
    multiplexers adapted for selectively bypassing registers of the reconfigurable chip to allow for an orderly data processing in runtime-delayed data;
    wherein the chip is one of a processing chip and a Field Programmable Gate Array chip.

2. The reconfigurable chip of claim 1, wherein each of at least some of the arithmetic logic cells has functional units that include at least one multiplier and one adding stage connected downstream of the at least one multiplier.

3. The reconfigurable chip of claim 1, wherein a digital DSP signal processor is formed by the arithmetic logic cells.

4. A reconfigurable processing chip, comprising:
    a plurality of data modification units, wherein:
        at least some of the data modification units are arithmetic logic cells that each:
            has three inputs A, B, and C adapted for feeding to the respective arithmetic logic cell respective ones of three data words A, B, and C on respective ones of the three inputs A, B, and C; and
            is adapted for performing within the respective arithmetic logic cell an operation of the data word A× the data word B+ the data word C; and
        each of at least some of the arithmetic logic cells has functional units that include at least one multiplier and one adding stage connected downstream of the at least one multiplier; and
    a bypass line in at least one of the arithmetic logic cells that has the functional units, wherein the bypass line is adapted for allowing data to pass by at least one of the functional units of the at least one arithmetic logic cell.

5. The reconfigurable processing chip of claim 4, wherein the bypass line is adapted for selectively allowing data words to bypass.

6. A reconfigurable processing chip, comprising:
    a plurality of data modification units, wherein at least some of the data modification units are arithmetic logic cells that each:
        has three inputs A, B, and C adapted for feeding to the respective arithmetic logic cell respective ones of three data words A, B, and C on respective ones of the three inputs A, B, and C; and
        is adapted for performing within the respective arithmetic logic cell an operation of the data word A × the data word B + the data word C; and
    a register adapted for providing a configurable register delay of a data relay in an arithmetic logic cell.

7. The reconfigurable processing chip of claim 6, wherein the data relay delaying register is adapted for a register delay of data words that are at least one of modified and linked in functional units of the arithmetic logic cells.

8. The reconfigurable processing chip of claim 6, wherein the data relay delaying register is adapted for a register delay of a data relay of unmodified data words.

9. The reconfigurable processing chip of claim 6, wherein the register for the data relay delay is adapted for a configurable data relay delay.

10. The reconfigurable processing chip of claim 6, wherein the register is a deep register adapted for functioning as an intermediate memory.

11. The reconfigurable processing chip of claim 6, wherein the register is adapted for being connected into and removed from a data path.

12. The reconfigurable processing chip of any one of claims 4, 5, 6, and 11, wherein the reconfigurable processing chip is a Field Programmable Gate Array (FPGA).

13. A Field Programmable Gate Array chip, comprising:
a plurality of data modification units, wherein at least some of the data modification units are arithmetic logic cells that each:
has three inputs A, B, and C adapted for feeding to the respective arithmetic logic cell respective ones of three data words A, B, and C on respective ones of the three inputs A, B, and C; and
is adapted for performing within the respective arithmetic logic cell an operation of the data word A × the data word B + the data word C; and
a multiplexer provided at an output of an arithmetic logic cell and adapted for connecting a result from the arithmetic logic cell to a bus.

14. The Field Programmable Gate Array chip of claim 13, wherein a width of the output is greater than a width of two data words to be linked.

15. A logic cell for a Field Programmable Gate Array chip, the logic cell adapted for performing an arithmetic-multiplicative operation on operands using the logic cell, comprising:
three inputs A, B, C adapted for feeding to the logic cell respective ones of three data words A, B, and C on the three inputs A, B, C;
wherein:
the logic cell is adapted for:
performing within the logic cell an operation of the data word A × the data word B + the data word C;
outputting data to a register and feeding the output data from the register back for further processing in the logic cell; and
synchronously receiving a plurality of data, some of the plurality of data being received from a register that delays the some of the plurality of data in order to effect the synchronization of the some of the plurality of data with other of the plurality of data.

16. A runtime-configurable logic cell for use in a reconfigurable processing chip, the runtime-configurable logic cell comprising:
a multiplier; and
an adder connected behind the multiplier;
wherein:
for two data word inputs A and B provided to the multiplier, the adder is adapted for adding a data word C for optimizing a function of A×B+C; and
the logic cell is adapted for:
outputting data to a register and feeding the output data back from the register for further processing in the logic cell; and
synchronously receiving a plurality of data, some of the plurality of data being received from a register that delays the some of the plurality of data in order to effect the synchronization of the some of the plurality of data with other of the plurality of data.

17. A runtime-configurable logic cell for use in one of a reconfigurable processing chip and a Field Programmable Gate Array chip, the runtime-configurable logic cell comprising:
a multiplier;
an adder; and
three data inputs adapted for data of two the data inputs to be fed to the multiplier and data of the third data input to be fed to the adder;
wherein the logic cell is adapted for:
outputting data to a register and feeding back the output data from the register into the logic cell; and
synchronously receiving a plurality of data, some of the plurality of data being received from a register that delays the some of the plurality of data in order to effect the synchronization of the some of the plurality of data with other of the plurality of data.

18. The runtime-configurable logic cell of claim 17, wherein the multiplier is adapted for being connectable to the adder for a result output by the multiplier to be fed to an input of the adder.

19. A runtime-configurable logic cell for use in a reconfigurable processing chip, the runtime-configurable logic cell comprising:
a multiplier;
an adder; and
three data inputs adapted for data of two the data inputs to be fed to the multiplier and data of the third data input to be fed to the adder;
wherein:
the multiplier is adapted for being connectable to the adder for a result output by the multiplier to be fed to an input of the adder; and
a result output by the logic cell is wider than its inputs and corresponds to a width of the result output by the multiplier.

20. A runtime-configurable logic cell for use in a Field Programmable Gate Array chip, the runtime-configurable logic cell, comprising:
a multiplier;
an adder;
three data inputs adapted for data of two the data inputs to be fed to the multiplier and data of the third data input to be fed to the adder;
a register; and
a multiplexer adapted for connecting the register to and removing the register from a data relay path.

21. The runtime-configurable logic cell of claim 20, wherein the register is a deep register adapted for functioning as an intermediate memory.

22. The runtime-configurable logic cell of claim 21, wherein the register is a first-in-first-out (FIFO) register.

23. The runtime-configurable logic cell of claim 22, wherein the FIFO register is adapted for a multi-clock-pulse intermediate storage of data.

24. A runtime-configurable logic cell array for use in a reconfigurable processing chip, the runtime-configurable logic cell array comprising:
logic cells, at least one of the logic cells comprising:
a multiplier;
an adder connected downstream of the multiplier;

at least one first register adapted for receiving output data from at least one of the multiplier and the adder and feeding the output data back for further processing in the logic cell;

at least further registers adapted for delaying arrival of data at the at least one of the logic cells to synchronize the arrival of the data with an arrival of other data at the at least one of the logic cells; and multiplexers adapted for selectively bypassing at least some of said first and further registers of the at least one of the logic cells to allow for an orderly data processing in runtime-delayed data; and programmable gate arrays surrounding the logic cells.

25. The runtime-configurable logic cell array of claim 24, further comprising:

register stages adapted for being configurably assigned to the logic cells.

26. A Field Programmable Gate Array chip, comprising:

a plurality of data modification units, wherein at least some of the data modification units are arithmetic logic cells that each:

has three inputs A, B, and C adapted for feeding to the respective arithmetic logic cell respective ones of three data words A, B, and C on respective ones of the three inputs A, B, and C; and is adapted for performing within the respective arithmetic logic cell an operation of the data word A× the data word B+ the data word C; and registers adapted for delaying arrival of data at respective ones of the plurality of data modification units to synchronize the arrival of the data with an arrival of other data at the respective modification units.

27. The Field Programmable Gate Array chip of claim 26, wherein the registers include a data relay delaying register that is adapted for a register delay of data words that are at least one of modified and linked in functional units of the arithmetic logic cells.

28. The Field Programmable Gate Array chip of claim 27, wherein the data relay delaying register is adapted for a register delay of a data relay of unmodified data words.

29. The Field Programmable Gate Array chip of claim 26, wherein the Field Programmable Gate Array chip is at least two-dimensionally interconnected.

30. The Field Programmable Gate Array chip of claim 26, wherein the Field Programmable Gate Array chip is reconfigurable in function and interconnection.

31. The Field Programmable Gate Array chip of claim 26, wherein the Field Programmable Gate Array chip is runtime reconfigurable in function.

32. The Field Programmable Gate Array chip of claim 26, wherein, for each of at least some of the arithmetic logic cells, a data storage device is adapted for providing data, locally written to the data storage device, for local modification.

33. The Field Programmable Gate Array chip of claim 26, wherein registers are adapted for receiving output data of one of the plurality of data modification units and for feeding the output data to an input of an element of the one of the plurality of modification units.

34. The Field Programmable Gate Array chip of claim 26, wherein the registers include a data relay delaying register that is adapted for register delay of unmodified data words.

35. The Field Programmable Gate Array chip of claim 26, wherein a width of an output of two linked data words is greater than the width of each of the two linked data words.

36. The Field Programmable Gate Array chip of claim 26, wherein the arithmetic logic cells are adapted for synchronously receiving a plurality of data, some of the plurality of data being receivable from a register that delays the some of the plurality of data in order to effect the synchronization of the some of the plurality of data with other of the plurality of data.

37. The Field Programmable Gate Array chip of claim 26, wherein the registers include a first-in-first-out register.

38. The Field Programmable Gate Array chip of claim 26, further comprising:

multiplexers adapted for selectively bypassing registers of the Field Programmable Gate Array chip to allow for an orderly data processing in runtime delayed data.

39. The Field Programmable Gate Array chip of claim 26, wherein a multiplier is adapted for connection to an adder for a result output by the multiplier to be fed to an input of the adder.

40. The Field Programmable Gate Array chip of claim 26, further comprising:

programmable gate arrays in a vicinity of the arithmetic logic cells for at least one of receiving data from the arithmetic logic cells and transmitting data to the arithmetic logic cells in order to combine data.

41. The Field Programmable Gate Array chip of claim 26, wherein the Field Programmable Gate Array chip is one of a processor, a data flow processor, a digital processor, and a programmable logic chip.

42. The Field Programmable Gate Array chip of claim 26, wherein the registers include a register that is a deep register having more than one register stage adapted for functioning as an intermediate memory.

43. The Field Programmable Gate Array chip of claim 26, wherein the registers include a register that is adapted for being configurably connected into and removed from a data path.

44. The Field Programmable Gate Array chip of claim 26, wherein:

registers are adapted for delaying arrival of data in respective ones of functional elements within the modification units to synchronize the arrival of the data with an arrival of other data at the respective functional elements; and the functional elements are at least one of arithmetically and logically combining elements.

45. The Field Programmable Gate Array chip of claim 26, wherein a FIFO register of the Field Programmable Gate Array chip is adapted for a multi-clock-pulse intermediate storage of data.

46. A runtime-configurable logic cell array for use in one of a reconfigurable processing chip and a field programmable logic chip, the runtime-configurable logic cell comprising:

logic cells, at least one of the logic cells comprising:

a multiplier;

an adder connected downstream of the multiplier;

at least one first register adapted for receiving output data from at least one of the multiplier and the adder and feeding the output data back for further processing in the logic cell;

at least two further registers adapted for delaying arrival of data at the at least one of the logic cells to synchronize the arrival of the data with an arrival of other data at the at least one of the logic cells; and multiplexers adapted for selectively bypassing at least some of said first and further registers of the at least one of the logic cells to allow for an orderly data processing in runtime-delayed data; and programmable gate arrays in a vicinity of the logic cells.

47. The runtime-configurable logic cell array of claim 46, wherein the logic cells are adapted for exchanging with each other data for combinatorial purposes.

48. The reconfigurable chip of claim 1, wherein the operation includes adding the data word C to the product of the data word A× the data word B.

49. The runtime-configurable logic cell of any one of claims 16 and 19, wherein the reconfigurable processing chip is a Field Programmable Gate Array (FPGA).

50. The runtime-configurable logic cell array of claim 24, wherein the reconfigurable processing chip is a Field Programmable Gate Array (FPGA).

51. The runtime-configurable logic cell array of claim 46, wherein the runtime-configurable logic cell array is for use in the reconfigurable processing chip and the reconfigurable processing chip is a Field Programmable Gate Array (FPGA).

52. A reconfigurable processing chip, comprising:
 a plurality of configurable cells arranged in a two-dimensional structure; and
 a configurable network interconnecting the configurable cells;
 wherein:
  each of at least some of the configurable cells is an arithmetic cell that comprises:
   at least three operand data inputs for receiving operands A, B, C, from the configurable network, at least one of the operand data inputs comprising an input register;
   at least one arithmetic unit processing the operands and producing result data; and
   at least one result output for transmitting said result data of the arithmetic unit to the configurable network, at least one of the at least one result output comprising an output register; and the at least one arithmetic unit:
    comprises at least two function units, the at least two function units including (a) at least one multiplier and (b) at least one adder; and
    is adapted to produce the result data by computing a function A times B plus C (A×B+C) on the operands.

53. The reconfigurable processing chip according to claim 52, wherein, within the arithmetic cell, result data of at least one result register and produced by the at least one arithmetic unit is fed back into the arithmetic cell for further processing.

54. The reconfigurable processing chip according to claim 52, wherein, within the arithmetic cell, at least some of the function units are bypassable.

55. The reconfigurable processing chip according to any one of claims 52 and 53, wherein the result data of the arithmetic cell is wider than a width of the received operands.

56. The reconfigurable processing chip according to any one of claims 52 and 53, wherein at least some of the registers have increased depth.

57. The reconfigurable processing chip according to any one of claims 52 and 53, wherein at least some of the registers are FIFOs.

58. The reconfigurable processing chip according to any one of claims 52, 53, and 54, wherein the arithmetic cells comprise at least one intermediate result register located between (a) the at least one multiplier and (b) one of he at least one adder.

59. The reconfigurable processing chip according to any one of claims 52, 53, and 54, wherein at least one of the at least one input register and at least one of the at least one output register comprise a related multiplexer for configurable insertion or bypassing of the respective register.

60. The reconfigurable processing chip according to claim 56, wherein at least one of the at least one input register and at least one of the at least one output register comprise a related multiplexer for configurable insertion or bypassing of the respective register.

61. The reconfigurable processing chip according to claim 57, wherein at least one of the at least one input register and at least one of the at least one output register comprise a related multiplexer for configurable insertion or bypassing of the respective register.

62. The reconfigurable processing chip according to claim 58, wherein at least one of the at least one input register, at least one of the at least one output register, and at least one of the intermediate result registers comprise a related multiplexer for configurable insertion or bypassing of the respective register.

63. The reconfigurable processing chip according to any one of claims 52, 53, and 54, wherein the reconfigurable processing chip is a field programmable gate array (FPGA) chip.

64. The reconfigurable processing chip according to claim 58, wherein the reconfigurable processing chip is a field programmable gate array (FPGA) chip.

65. The reconfigurable processing chip according to claim 59, wherein the reconfigurable processing chip is a field programmable gate array (FPGA) chip.

66. The reconfigurable processing chip according to claim 60, wherein the reconfigurable processing chip is a field programmable gate array (FPGA) chip.

67. The reconfigurable processing chip according to claim 61, wherein the reconfigurable processing chip is a field programmable gate array (FPGA) chip.

68. The reconfigurable processing chip according to claim 62, wherein the reconfigurable processing chip is a field programmable gate array (FPGA) chip.

69. A reconfigurable processing chip comprising:
 a plurality of configurable cells arranged in a two-dimensional structure; and
 a configurable network connecting the configurable cells;
 wherein:
  each of at least some of the configurable cells is an arithmetic cell that comprises:
   at least four operand data inputs A, D0, C, and D2 for receiving operands from the configurable network, at least one of the operand inputs comprising an input register;
   at least one arithmetic unit processing the operands and producing result data, the at least one arithmetic unit comprising at least three function units, the functions units including (a) at least one multiplier and (b) at least two adders; and
   at least one result output for transmitting said result data of the arithmetic unit to the configurable network;
  at least one of the at least one result output comprises an output register;
  the arithmetic unit is adapted to produce the result data by computing an intermediate result Q1 by adding operands of D0 and D2 (Q1=D0+D2) in a first Add stage and computing a result of an operand of A times Q1 plus an operand of C (A×Q1+C) in a subsequent MultiplyAdd stage one the operand data; and
  the intermediate result Q1 is configurably connectable to the operand input D0.

70. The reconfigurable chip according to claim 69, wherein, within the arithmetic cell, at least one multiplexer is located between the first Add stage for computing Q1=D0+D2 and the subsequent MultiplyAdd stage for computing A×Q1+C for selectively bypassing the first Add stage.

71. The reconfigurable chip according to any of claims 69 and 70, wherein, within the arithmetic cell, at least some of the function units are bypassable.

72. The reconfigurable chip according to claim 71, wherein, within the arithmetic cell, result data of at least one result register and produced by the at least one arithmetic unit is fed back into the arithmetic cell for further processing.

73. The reconfigurable chip according to any one of claims 69, 70, 71, and 72, wherein the result data of the arithmetic cell is wider than a width of the received operands.

74. The reconfigurable chip according to any one of claims 69, 70, 71, and 72, wherein at least some of the registers have increased depth.

75. The reconfigurable chip according to any one of claims 69, 70, 71, and 72, wherein at least some of the registers are FIFOs.

76. The reconfigurable chip according to any one of claims 69, 70, 71, and 72, wherein the arithmetic cells comprise, at least one intermediate result register located between at least one adder and a subsequent function unit.

77. The reconfigurable chip according to any one of claims 69, 70, 71, and 72, wherein at least one of the at least one input register and at least one of the at least one output register comprise a related multiplexer for configurable insertion or bypassing of the respective register.

78. The reconfigurable processing chip according to claim 74, wherein at least one of the at least one input register and at least one of the at least one output register comprise a related multiplexer for configurable insertion or bypassing of the respective register.

79. The reconfigurable processing chip according to claim 75, wherein at least one of that at least one input register and at least one of the at least one output register comprise a related multiplexer for configurable insertion or bypassing of the respective register.

80. The reconfigurable processing chip according to claim 76, wherein at least one of at least one input register, at least one of the at least one output register, and at least one of the at least one intermediate result register comprise a related multiplexer for configurable insertion or bypassing of the respective register.

81. The reconfigurable chip according to any one of claims 69, 70, 72, 78, 79, and 80, wherein the reconfigurable processing chip is a field programmable gate array (FPGA) chip.

82. The reconfigurable processing chip according to claim 71, wherein the reconfigurable processing chip is a field programmable gate array (FPGA) chip.

83. The reconfigurable processing chip according to claim 76, wherein the reconfigurable processing chip is a field programmable gate array (FPGA) chip.

84. The reconfigurable processing chip according to claim 77, wherein the reconfigurable processing chip is a field programmable gate array (FPGA) chip.

85. A reconfigurable processing chip, comprising:
a plurality of configurable cells arranged in a two-dimensional structure; and
a configurable network connecting the configurable cells;
wherein:
each of at least some of the configurable cells is an arithmetic cell that comprises:
at least three operand data inputs for receiving respective operands, A, B, C, from the configurable network;
at least one of the at least three operand inputs comprising an input register;
at least one arithmetic unit processing the operands and producing result data, the at least one arithmetic unit comprising at least two function units, the fUnction units including (a) at least one multiplier and (b) at least one adder;
the at least one arithmetic unit is adapted to produce the result data by computing a fUnction A times B plus C (A×B+C) on the operand data;
at least one result output for transmitting said result data of the arithmetic unit to the configurable network, at least one of the at least one result output comprising an output register; and
an interconnection arrangement for selectively at least one of (a) chaining at least two of the function units for transferring at least one output data of at least one of said function units as input data to at least another one of said function units, (b) bypassing at least one of the function units, and (c) feeding at least one of said operands (A, B, C) as input to at least one of said function units.

86. The reconfigurable processing chip according to claim 85, wherein, within the arithmetic cell, result data of at least one result register and produced by the at least one arithmetic unit is fed back into the arithmetic cell for further processing.

87. The reconfigurable processing chip according to claim 85, wherein, within the arithmetic cell, at least some of the function units are bypassable 88. The reconfigurable processing chip according to claim 85 or 86, wherein at least some of the registers have increased depth.

89. The reconfigurable processing chip according to claim 85 or 86, wherein at least some of the registers are FIFOs.

90. The reconfigurable processing chip according to any one of the claims 85, 86, and 87, wherein the arithmetic cells comprise at least one intermediate result register located between (a) the at least one multiplier and (b) one of the at least one adder.

91. The reconfigurable processing chip according to any one of the claims 85, 86, and 87, wherein at least one of the at least one input register and at least one of the at least one output register comprise a related multiplexer for configurable insertion or bypassing of the respective register.

92. The reconfigurable processing chip according to claim 88, wherein at least one of the at least one input register and at least one of the at least one output register comprise a related multiplexer for configurable insertion or bypassing of the respective register.

93. The reconfigurable processing chip according to claim 89, wherein at least one of the at least one input register and at least one of the at least one output register comprise a related multiplexer for configurable insertion or bypassing of the respective register.

94. The reconfigurable processing chip according to claim 90, wherein at least one of the at least one input register, at least one of the at least one output register, and at least one of the intermediate result registers comprise a related multiplexer for configurable insertion or bypassing of the respective register.

95. The reconfigurable processing chip according to claim 90, wherein the reconfigurable processing chip is a field programmable gate array (FPGA) chip.

96. The reconfigurable processing chip according to claim 91, wherein the reconfigurable processing chip is a field programmable gate array (FPGA) chip.

97. The reconfigurable processing chip according to claim 92, wherein the reconfigurable processing chip is a field programmable gate array (FPGA) chip.

98. The reconfigurable processing chip according to claim 93, wherein the reconfigurable processing chip is a field programmable gate array (FPGA) chip.

99. The reconfigurable processing chip according to claim 94, wherein the reconfigurable processing chip is a field programmable gate array (FPGA) chip.

100. The reconfigurable processing chip according to claim 85, wherein:
at least one of the arithmetic cells comprises further operand data inputs for receiving operands D0 and D2; and
for each of at least one of said at least one arithmetic unit of said at least one of the arithmetic cells, the arithmetic unit:
includes at least one multiplier and at least two adders; and
is adapted to produce the result data by computing an intermediate result Q1 by adding operands D0 and D2 (Q1=D0+D2) in a first Add stage and computing a result A times Q1 plus C (A×Q1+C) in a subsequent MultiplyAdd stage on the operand data.

101. The reconfigurable processing chip according to claim 100, wherein, within an arithmetic cell, result data of at least one result register is fed back into the arithmetic cell for further processing.

102. The reconfigurable processing chip according to claim 100, wherein, within an arithmetic cell, at least some of the function units are bypassable.

103. The reconfigurable processing chip according to claim 85 or 100, wherein at least some of the registers have increased depth.

104. The reconfigurable processing chip according to any one of the claims 100, 101 and 102, wherein at least some of the registers are FIFOs.

105. The reconfigurable processing chip according to any one of the claims 100, 101, 102 and 103, wherein the arithmetic cells comprise at least one intermediate result register located between an adder and a multiplier.

106. The reconfigurable processing chip according to claim 103, wherein the reconfigurable processing chip is a field programmable gate array (FPGA) chip.

107. The reconfigurable processing chip according to claim 104, wherein the reconfigurable processing chip is a field programmable gate array (FPGA) chip.

108. The reconfigurable processing chip according to claim 105, wherein the reconfigurable processing chip is a field programmable gate array (FPGA) chip.

109. The reconfigurable processing chip according to claim 85, wherein, for each of at least one of said at least one arithmetic unit, the arithmetic unit includes at least one multiplier and at least two adders.

110. The reconfigurable processing chip according to claim 109, wherein, within the arithmetic cell, result data of at least one result register is fed back into the arithmetic cell for further processing.

111. The reconfigurable processing chip according to claim 109, wherein, within the arithmetic cell, at least some of the function units are bypassable.

112. The reconfigurable processing chip according to any one of the claims 85, 86, 87, 100, 101, 102, 109, 110, and 111, wherein the reconfigurable processing chip is a field programmable gate array (FPGA) chip.

113. A reconfigurable processing chip, comprising:
a plurality of configurable cells arranged in a two-dimensional structure; and
a configurable network connecting the configurable cells;
wherein each of at least some of the configurable cells is an arithmetic cell that comprises:
at least four operand data inputs A, B, C, and D for receiving operands from the configurable network;
at least one of the at least four operand inputs comprising an input register;
at least one arithmetic unit processing the operands and producing result data, the at least one arithmetic unit comprising at least three function units, the function units including (a) at least one multiplier and (b) at least two adders; and
at least one result output for transmitting said result data of the arithmetic unit to the configurable network, at least one of the at least one result output comprising an output register.

114. The reconfigurable processing chip according to claim 113, wherein, within the arithmetic cell, at least some of the function units are bypassable.

115. The reconfigurable processing chip according to claim 114, wherein, within the arithmetic cell, result data of at least one result register and produced by the at least one arithmetic unit is fed back into the arithmetic cell for further processing.

116. The reconfigurable processing chip according to any one of claims 113, 114 and 115, wherein a result of the arithmetic cell is wider than a width of at least one of the received operands.

117. The reconfigurable processing chip according to any one of claims 113, 114 and 115, wherein at least some of the registers have increased depth.

118. The reconfigurable processing chip according to any one of claims 113, 114 and 115, wherein at least some of the registers are FIFOs.

119. The reconfigurable processing chip according to any one of claims 113, 114 and 115, wherein the arithmetic cell comprises at least one intermediate result register located between at least one adder and a subsequent function unit.

120. The reconfigurable processing chip according to any one of claims 113, 114 and 115, wherein at least one of the input registers and at least one of the output registers comprise a related multiplexer for configurable insertion or bypassing of the respective register.

121. The reconfigurable processing chip according to claim 117, wherein at least one of the at least one input register and at least one of the at least one output register comprise a related multiplexer for configurable insertion or bypassing of the respective register.

122. The reconfigurable processing chip according to claim 118, wherein at least one of the at least one input register and at least one of the at least one output register comprise a related multiplexer for configurable insertion or bypassing of the respective register.

123. The reconfigurable processing chip according to claim 119, wherein at least one of the at least one input register, at least one of the at least one output register, and at least one of the intermediate result registers comprise a related multiplexer for configurable insertion or bypassing of the respective register.

124. The reconfigurable processing chip according to any one of the claims 113, 114, and 115, wherein the reconfigurable processing chip is a field programmable gate array (FPGA) chip.

125. The reconfigurable processing chip according to claim 119, wherein the reconfigurable processing chip is a field programmable gate array (FPGA) chip.

126. The reconfigurable processing chip according to claim 120, wherein the reconfigurable processing chip is a field programmable gate array (FPGA) chip.

127. The reconfigurable processing chip according to claim 121, wherein the reconfigurable processing chip is a field programmable gate array (FPGA) chip.

128. The reconfigurable processing chip according to claim 122, wherein the reconfigurable processing chip is a field programmable gate array (FPGA) chip.

129. The reconfigurable processing chip according to claim 123, wherein the reconfigurable processing chip is a field programmable gate array (FPGA) chip.

* * * * *

UNITED STATES PATENT AND TRADEMARK OFFICE
CERTIFICATE OF CORRECTION

PATENT NO. : 7,595,659 B2
APPLICATION NO. : 10/398546
DATED : September 29, 2009
INVENTOR(S) : Vorbach et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1012 days.

Signed and Sealed this

Fourteenth Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,595,659 B2  
APPLICATION NO. : 10/398546  
DATED : September 29, 2009  
INVENTOR(S) : Martin Vorbach et al.

Page 1 of 1

It is certified that error appears in the above-identified patent and that said Letters Patent is hereby corrected as shown below:

On the Title Page:

Add the following text: item -- (60) Provisional Application No. 60/238,855, filed on Oct. 6, 2000. --

Signed and Sealed this
Nineteenth Day of July, 2016

Michelle K. Lee
*Director of the United States Patent and Trademark Office*